United States Patent
Son et al.

(10) Patent No.: US 8,552,491 B2
(45) Date of Patent: Oct. 8, 2013

(54) SEMICONDUCTOR DEVICES SEMICONDUCTOR PILLARS AND METHOD OF FABRICATING THE SAME

(75) Inventors: Yong-Hoon Son, Yongin-si (KR); Jong-Wook Lee, Suwon-si (KR); Jong-Hyuk Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 290 days.

(21) Appl. No.: 12/831,577

(22) Filed: Jul. 7, 2010

(65) Prior Publication Data

US 2011/0039381 A1 Feb. 17, 2011

(30) Foreign Application Priority Data

Aug. 11, 2009 (KR) .......................... 10-2009-73975

(51) Int. Cl.
*H01L 29/78* (2006.01)
(52) U.S. Cl.
USPC 257/328; 257/510; 257/E29.02; 257/E29.262
(58) Field of Classification Search
USPC ............. 257/328, 510, E29.02, E29.262
See application file for complete search history.

(56) References Cited

U.S. PATENT DOCUMENTS

| 6,242,775 B1 * | 6/2001 | Noble ........................... 257/330 |
| 6,759,730 B2 | 7/2004 | Chaudhry et al. |
| 2007/0075359 A1 | 4/2007 | Yoon et al. |
| 2009/0004813 A1 | 1/2009 | Lee |

FOREIGN PATENT DOCUMENTS

| JP | 2003-179067 | 6/2003 |
| KR | 1020030024626 A | 3/2003 |
| KR | 1020070038233 A | 4/2007 |
| KR | 1020080113854 A | 12/2008 |

* cited by examiner

*Primary Examiner* — Zandra Smith
*Assistant Examiner* — Toniae Thomas
(74) *Attorney, Agent, or Firm* — Myers Bigel Sibley & Sajovec

(57) ABSTRACT

A semiconductor device includes a trench isolation region provided on a substrate and defining first and second active regions separated from each other. A first semiconductor pillar protruding upward from the first active region is provided. A second semiconductor pillar protruding upward from the second active region is provided. A first gate mask extending to cross over the first and second active regions is provided. The first gate mask surrounds upper sidewalls of the first and second semiconductor pillars. A first gate line formed below the first gate mask, separated from the first and second active regions, and surrounding parts of sidewalls of the first and second semiconductor pillars is provided.

20 Claims, 24 Drawing Sheets

SEMICONDUCTOR DEVICES SEMICONDUCTOR PILLARS AND METHOD OF FABRICATING THE SAME

CROSS-REFERENCE TO RELATED APPLICATION

This application claims the benefit of priority under 35 U.S.C. §119 from Korean Patent Application No. 10-2009-0073975, filed on Aug. 11, 2009, the contents of which are hereby incorporated herein by reference in its entirety.

BACKGROUND

Example embodiments relate to semiconductor devices, and more specifically, to semiconductor devices having increased integration density and methods of fabricating such devices.

Demand for semiconductor devices that are compact in size and consume low electric power has increased. Research into reducing the size of elements constituting the semiconductor device has been under way.

SUMMARY

Example embodiments provide semiconductor devices that may have improved integration density and methods of fabricating such devices.

According to example embodiments, a semiconductor device includes a substrate. A trench isolation region is provided on the substrate to define first and second spaced-apart active regions. A first semiconductor pillar is provided that protrudes upward from the first active region, and a second semiconductor pillar is provided that protrudes upward from the second active region. A first gate mask extends to cross over the first and second active regions and to surround upper portion of sidewalls of the first and second semiconductor pillars. A first gate line is provided below the first gate mask, the first gate lie being spaced-apart from the first and second active regions. The first gate line may surround parts of sidewalls of the first and second semiconductor pillars.

The device may further include a first conductive pattern formed on an upper sidewall of the first active region, and a second conductive pattern formed on an upper sidewall of the second active region.

The device may further include a second gate line and a first conductive pattern that is on the upper sidewall of the first active region and on a top surface of a portion of the first active region that is between the first and second gate lines, and a second conductive pattern that is on the upper sidewall of the second active region and on a top surface of a portion of the second active region that is between the first and second gate lines.

The sidewall of the first gate line may be vertically aligned with a sidewall of the first gate mask.

The device may further include a buffer insulating layer between the first gate line and the first and second active regions, the buffer insulating layer covering top surfaces of the first and second active regions.

The device may further include a buffer insulating pattern formed below the first gate line. The buffer insulating pattern may have a sidewall that is vertically aligned with a sidewall of the first gate line.

The device may further include: a first impurity region provided in the first active region adjacent to the first conductive pattern; a second impurity region provided in an upper region of the first semiconductor pillar; a third impurity region provided in the second active region adjacent to the second conductive pattern; and a fourth impurity region provided in an upper region of the second semiconductor pillar.

The first and third impurity regions may extend from upper regions of the first and second active regions to lower regions of the first and second semiconductor pillars, respectively.

At least one of the first to fourth impurity regions may not horizontally overlap the first gate line.

The device may further include a gap fill insulating layer provided at both sides of the first gate line and between the upper regions of the first and second active regions. The portion extending between the upper regions of the first and second active regions may constitute a part of the trench isolation region.

The device may further include: a third semiconductor pillar protruding upward from the first active region that is spaced-apart from the first semiconductor pillar; a fourth semiconductor pillar protruding upward from the second active region that is spaced-apart from the second semiconductor pillar; and a second gate mask that is spaced-apart from the first gate mask, the second gate mask extending to cross over the first active region. The second gate mask may surround upper sidewalls of the third and fourth semiconductor pillars. The device may further include a second gate line below the second gate mask. The second gate line may be spaced-apart from the first and second active regions and may surround parts of the sidewalls of the third and fourth semiconductor pillars.

According to other example embodiments, methods of fabricating a semiconductor device are provided in which a trench isolation region that defines an active region is formed in a substrate. An intermediate material layer and a gate mask layer, which are sequentially stacked, are formed on the substrate having the trench isolation region. A hole is formed that penetrates the gate mask layer and the buffer insulating layer to expose a predetermined region of the active region. A semiconductor pillar is formed in the hole. The gate mask layer is patterned to form a gate mask that crosses over the active region. The gate mask is formed to surround a first upper portion of a sidewall of the semiconductor pillar. The intermediate material layer is selectively removed to expose a second portion of the sidewall of the semiconductor pillar. A gate pattern is formed that surrounds the exposed second portion of the sidewall of the semiconductor pillar. The gate pattern extends across the trench isolation region. The upper region of the trench isolation region is etched to expose an upper sidewall of the active region. A conductive pattern is formed on the exposed upper sidewall of the active region.

In some embodiments, the trench isolation region may be formed by: forming an isolation trench in the semiconductor substrate; forming an isolation insulating layer that partially fills the isolation trench; and forming a sacrificial layer that fills the remainder of the isolation trench, the sacrificial layer being formed of a material having an etch selectivity with respect to the isolation insulating layer. The sacrificial layer may be removed to expose the upper sidewall of the active region during the etching of the upper region of the trench isolation region.

In other embodiments, the trench isolation region may be formed by: forming an isolation trench in the semiconductor substrate; forming an isolation insulating layer that partially fills the isolation trench, the isolation insulating layer including a lower isolation insulating layer and an upper isolation insulating layer, which are sequentially stacked; and forming a sacrificial layer that fills the remainder of the isolation trench, the sacrificial layer being formed of a material having an etch selectivity with respect to the upper isolation insulating layer. The sacrificial layer may be removed to expose the upper sidewall of the active region during the etching of the upper region of the trench isolation region.

The gate pattern may be formed to have a sidewall that is vertically aligned with a sidewall of the gate mask.

The method may further include forming a buffer insulating layer on the substrate having the trench isolation region before forming the intermediate material layer.

The method may further include forming an inter-gate insulating layer on the substrate at both sides of the gate patterns, and then forming a capping layer that covers the inter-gate insulating layer and the semiconductor pillar.

In some embodiments, etching the upper region of the trench isolation region may include: forming a hole that penetrates the capping layer, the inter-gate insulating layer and the buffer insulating layer to expose a part of the trench isolation region; forming a sidewall spacer on a sidewall of the hole; and isotropically etching the trench isolation region using the capping layer, the sidewall spacer and the buffer insulating layer as an etch mask.

In some embodiments, the method may further include: forming a capping layer covering the semiconductor pillar and the gate mask layer after forming the semiconductor pillar; patterning the capping layer together with the gate mask layer during the patterning of the gate mask layer to form a capping pattern; etching the buffer insulating layer below the gate pattern after forming the gate pattern, and forming a defined buffer insulating pattern below the gate pattern; and forming sidewall spacers on sidewalls of the buffer insulating pattern, the gate pattern, the gate mask and the capping pattern.

The conductive pattern may be formed to extend in an upward direction of the active region at both sides of the gate pattern from the upper sidewall of the active region.

The method may further include forming a contact conductive layer on a top surface of the semiconductor pillar while the conductive pattern is formed.

According to still other example embodiments, methods of fabricating a semiconductor device include forming a trench isolation region that defines spaced-apart first and second active regions in a semiconductor substrate. The trench isolation region includes an isolation insulating layer and a sacrificial layer, which are sequentially stacked. A buffer insulating layer, an intermediate material layer and a gate mask layer, which are sequentially stacked, are formed on the substrate having the trench isolation region. First and third holes that penetrate the gate mask layer, the intermediate material layer and the buffer insulating layer are formed to expose predetermined regions of the first active region, and second and fourth holes that penetrate the gate mask layer, the intermediate material layer and the buffer insulating layer are formed to expose predetermined regions of the second active region. First to fourth semiconductor pillars are formed in the first to fourth holes, respectively. The gate mask layer is patterned to form first and second gate masks that cross over the first active region to extend across the second active region. The first gate mask is formed to surround portions of the first and second semiconductor pillars, and the second gate mask is formed to surround portions of the third and fourth semiconductor pillars. The intermediate material layer is selectively removed to expose sidewalls of the first to fourth semiconductor pillars that are between the first and second gate masks and the buffer insulating layer. A first gate line is formed to surround the exposed sidewalls of the first and second semiconductor pillars, and a second gate line is formed to surround the exposed sidewalls of the third and fourth semiconductor pillars. An inter-gate insulating layer is formed between the first and second gate lines. A capping layer is formed on the substrate having the inter-gate insulating layer. The capping layer, the inter-gate insulating layer and the buffer insulating layer are patterned to form an opening that exposes the sacrificial layer disposed between the first to fourth semiconductor pillars. The exposed sacrificial layer is selectively removed to expose the upper sidewalls of the first and second active regions. A first conductive pattern is formed on the upper sidewall of the first active region, and a second conductive pattern is formed on the upper sidewall of the second active region.

The methods may further include forming a sidewall spacer on a sidewall of the opening after forming the opening.

According to yet other example embodiments, methods of fabricating a semiconductor device include forming a trench isolation region that defines spaced-apart first and second active regions in a semiconductor substrate. The trench isolation region includes an isolation insulating layer and a sacrificial layer, which are sequentially stacked. A buffer insulating layer, an intermediate material layer and a gate mask layer, which are sequentially stacked, are formed on the substrate having the trench isolation region. First and third holes are formed that penetrate the buffer insulating layer, the intermediate material layer and the gate mask layer to expose predetermined regions of the first active region, and second and fourth holes are formed that penetrate the buffer insulating layer, the intermediate material layer and the gate mask layer to expose predetermined regions of the first active region predetermined regions of the second active region. First to fourth semiconductor pillars are formed in the first to fourth holes, respectively. The gate mask layer is patterned to form first and second gate masks that cross over the first active region to extend across the second active region. The first gate mask is formed to surround portions of the first and second semiconductor pillars, and the second gate mask is formed to surround portions of the third and fourth semiconductor pillars. The intermediate material layer is selectively removed to expose sidewalls of the first to fourth semiconductor pillars that are disposed between the first and second gate masks and the buffer material layer. A first gate line is formed to surround the exposed sidewalls of the first and second semiconductor pillars, and a second gate line is formed to surround the exposed sidewalls of the third and fourth semiconductor pillars. The buffer insulating layer is etched to expose the sacrificial layer of the trench isolation region disposed between the first and second gate lines and the top surface of the active region, and buffer insulating patterns are formed below the first and second gate lines.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION

Figure 1:
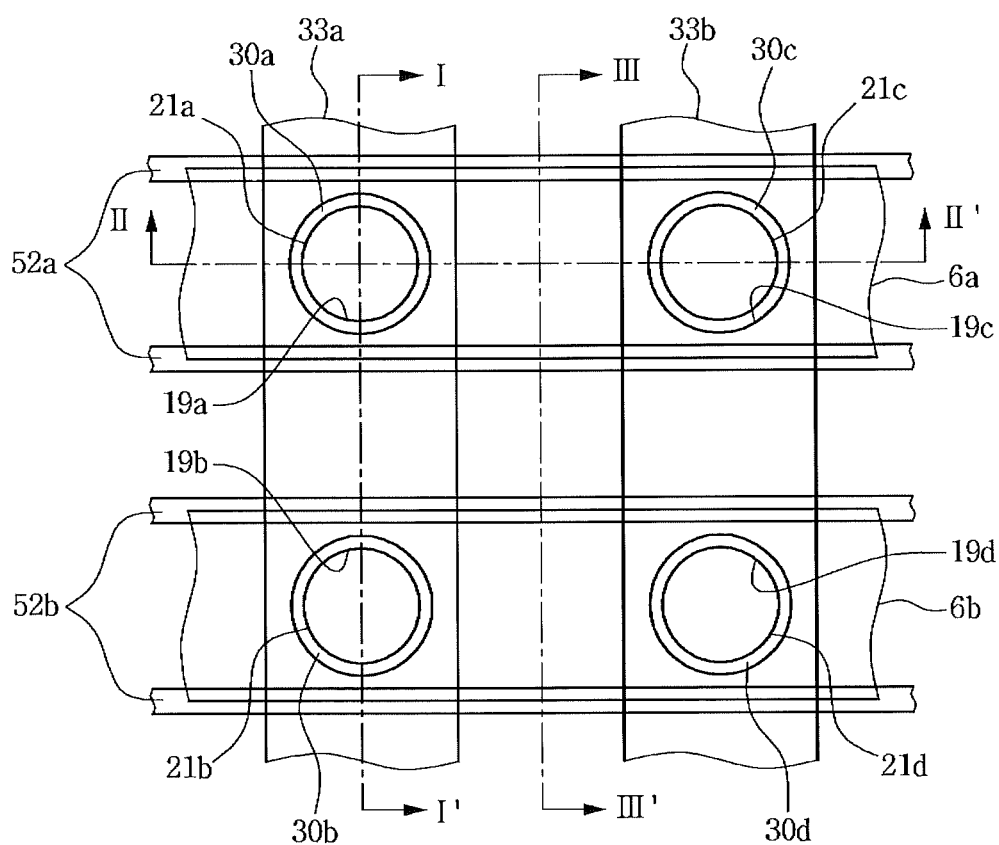
FIG. 1 is a plan view of a semiconductor device according to example embodiments.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thickness of layers and regions may be exaggerated for clarity. Also, when a layer is referred to as being "on" another layer or a substrate, it may be directly formed on the layer or substrate or one or more additional layers or elements may be interposed therebetween. Like reference numerals designate like elements throughout the specification.

Figure 14:
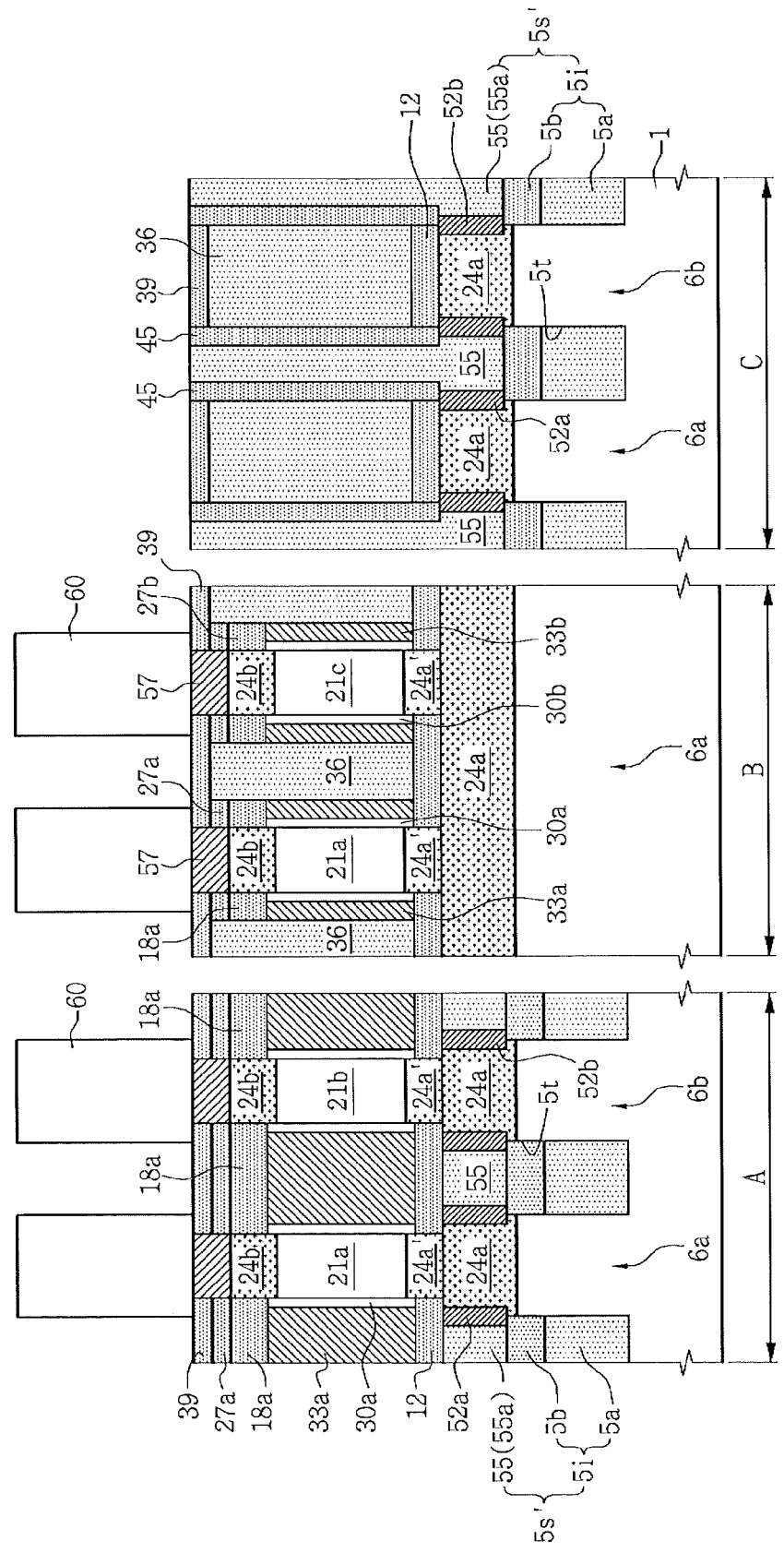
FIG. 14 is a cross-sectional view of a semiconductor device according to another example embodiment.
Figure 15:
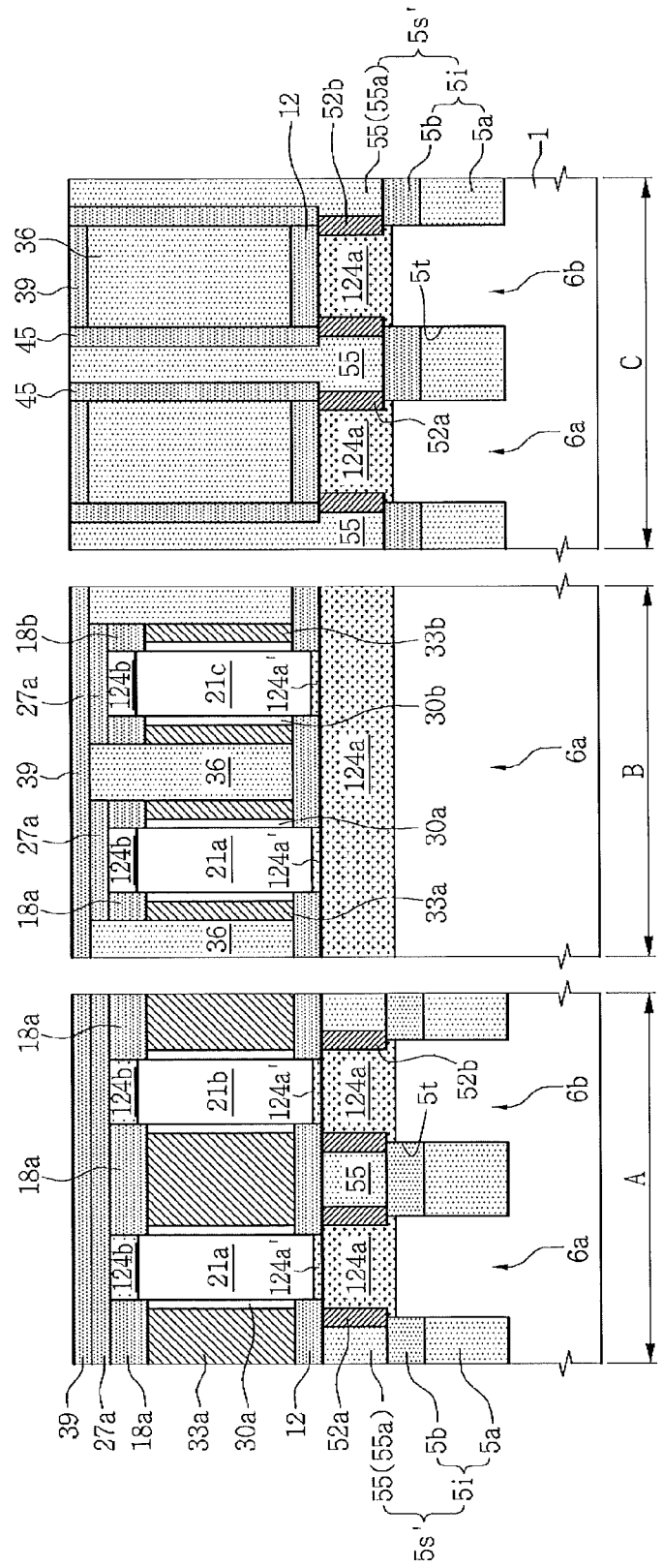
FIG. 15 is a cross-sectional view of a semiconductor device according to still another example embodiment.

FIG. 1 is a plan view of a semiconductor device according to example embodiments. FIGS. 2 to 13 are cross-sectional views of a semiconductor device according to an example embodiment. FIG. 14 is a cross-sectional view of a semiconductor device according to another example embodiment. Finally, FIG. 15 is a cross-sectional view of a semiconductor device according to still another example embodiment. In FIGS. 2 to 15, the region labeled "A" is a region taken along line I-I' of FIG. 1, the region labeled "B" is a region taken along line II-II' of FIG. 1, and the region labeled "C" is a region taken along line of FIG. 1.

Figure 16:
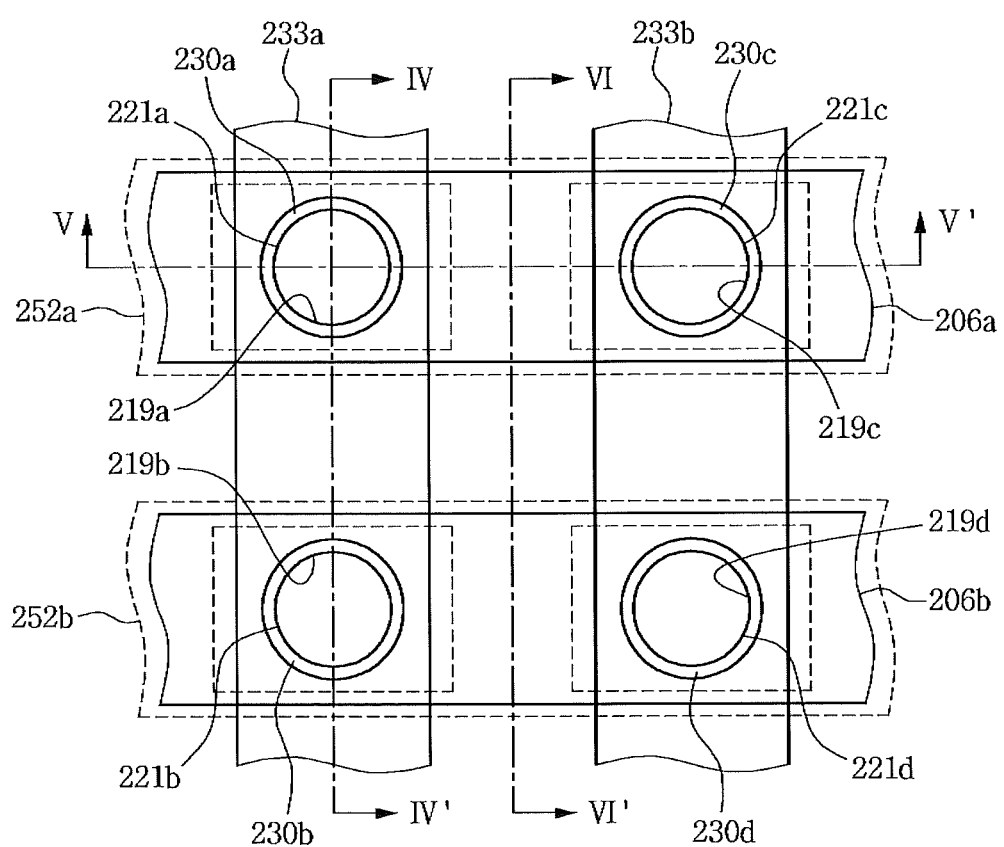
FIG. 16 is a plan view of a semiconductor device according to yet another example embodiment.
Figure 22:
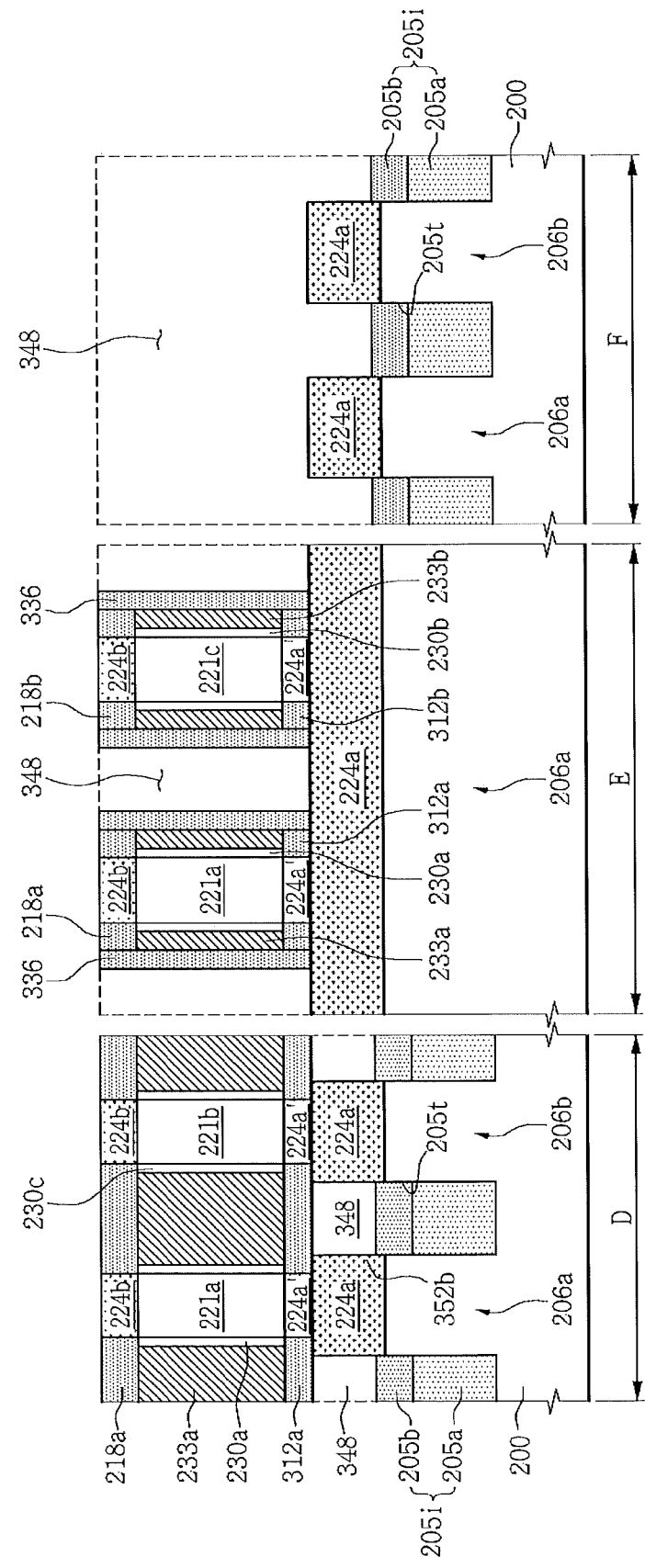
FIGS. 22 to 24 are cross-sectional views of a semiconductor device according to yet another example embodiment.
Figure 23:
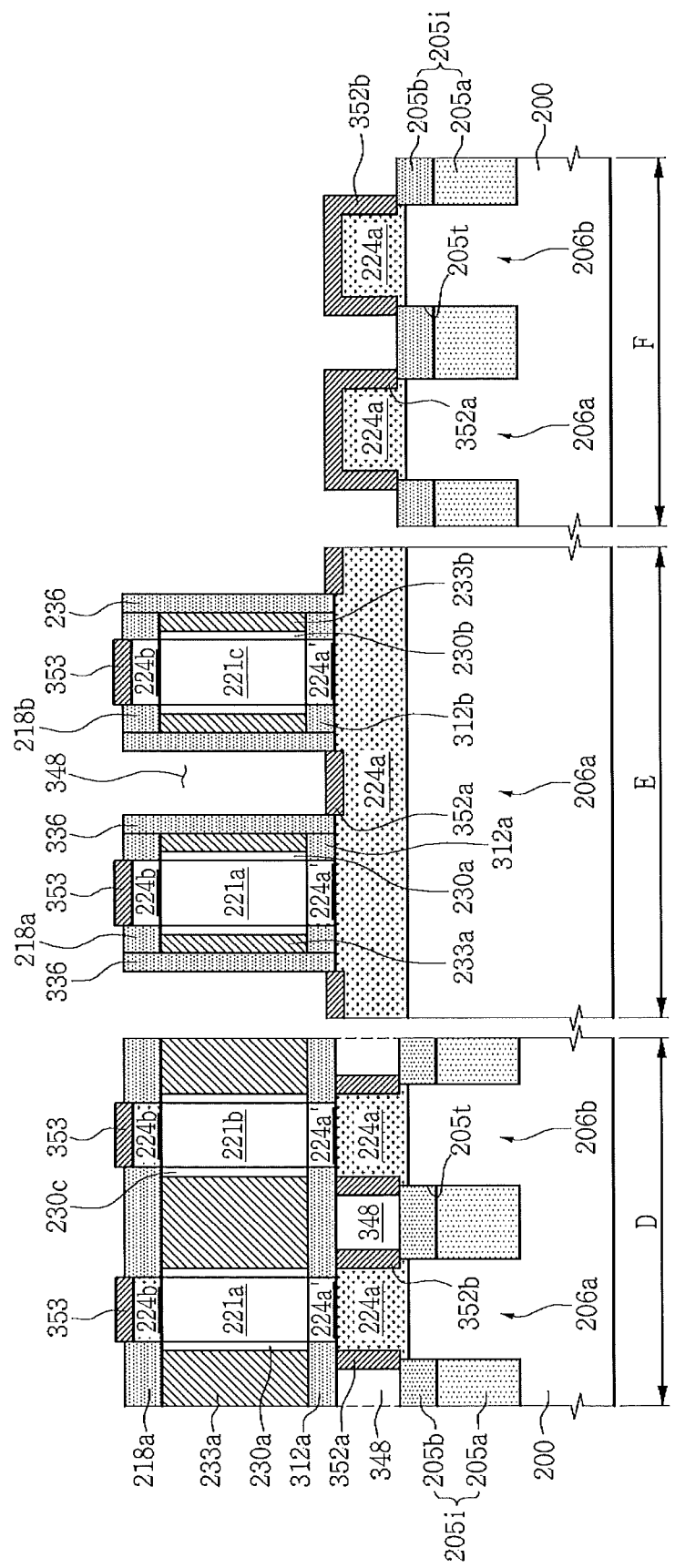
Figure 24:
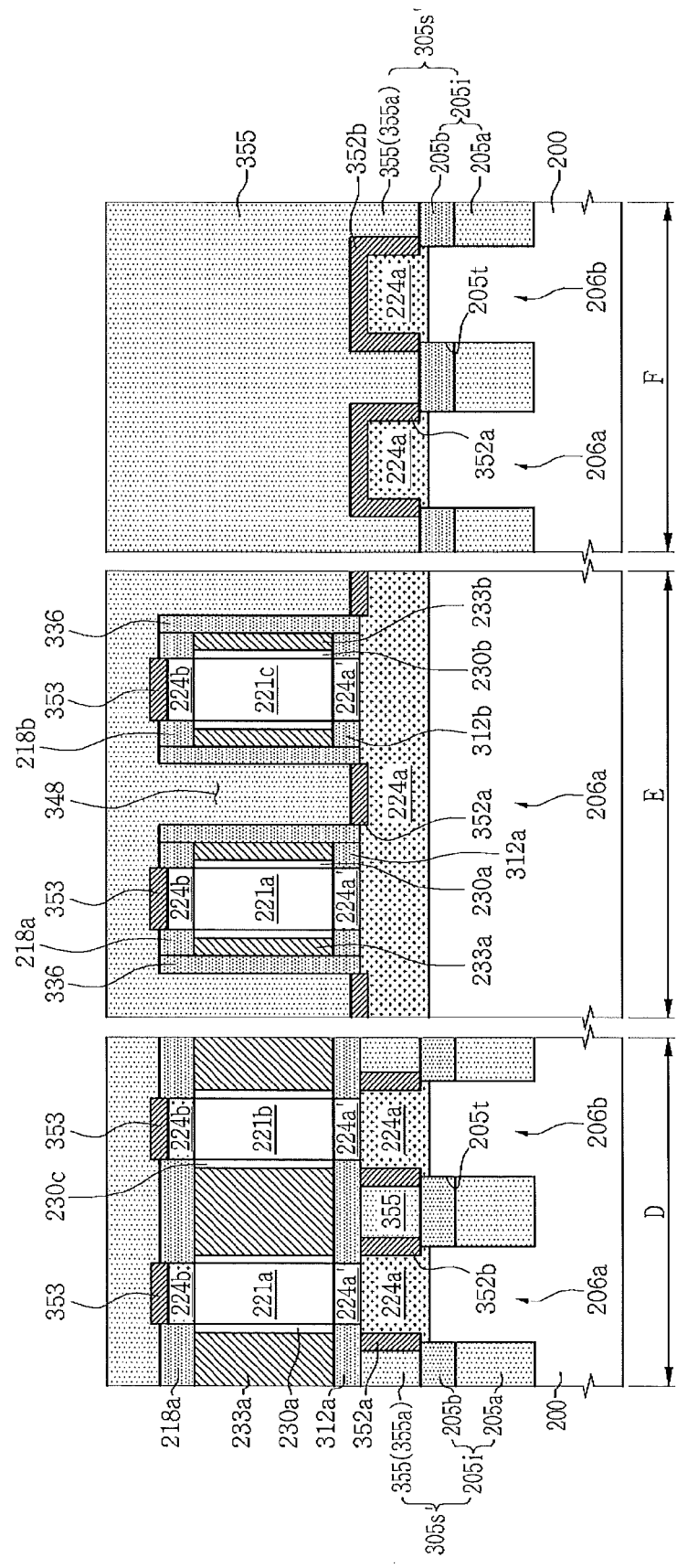

FIG. 16 is a plan view of a semiconductor device according to yet another example embodiment. FIGS. 17 to 21 are cross-sectional views of a semiconductor device according to yet another example embodiment. FIGS. 22 to 24 are cross-sectional views of a semiconductor device according to yet another example embodiment. In FIGS. 17 to 24, the region labeled "D" is a region taken along line IV-IV' of FIG. 16, the region labeled "E" is a region taken along line V-V' of FIG. 16, and the region labeled "F" is a region taken along line VI-VI' of FIG. 16.

First, a semiconductor device according to an example embodiment will be described below with reference to FIGS. 1 and 13.

Figure 13:
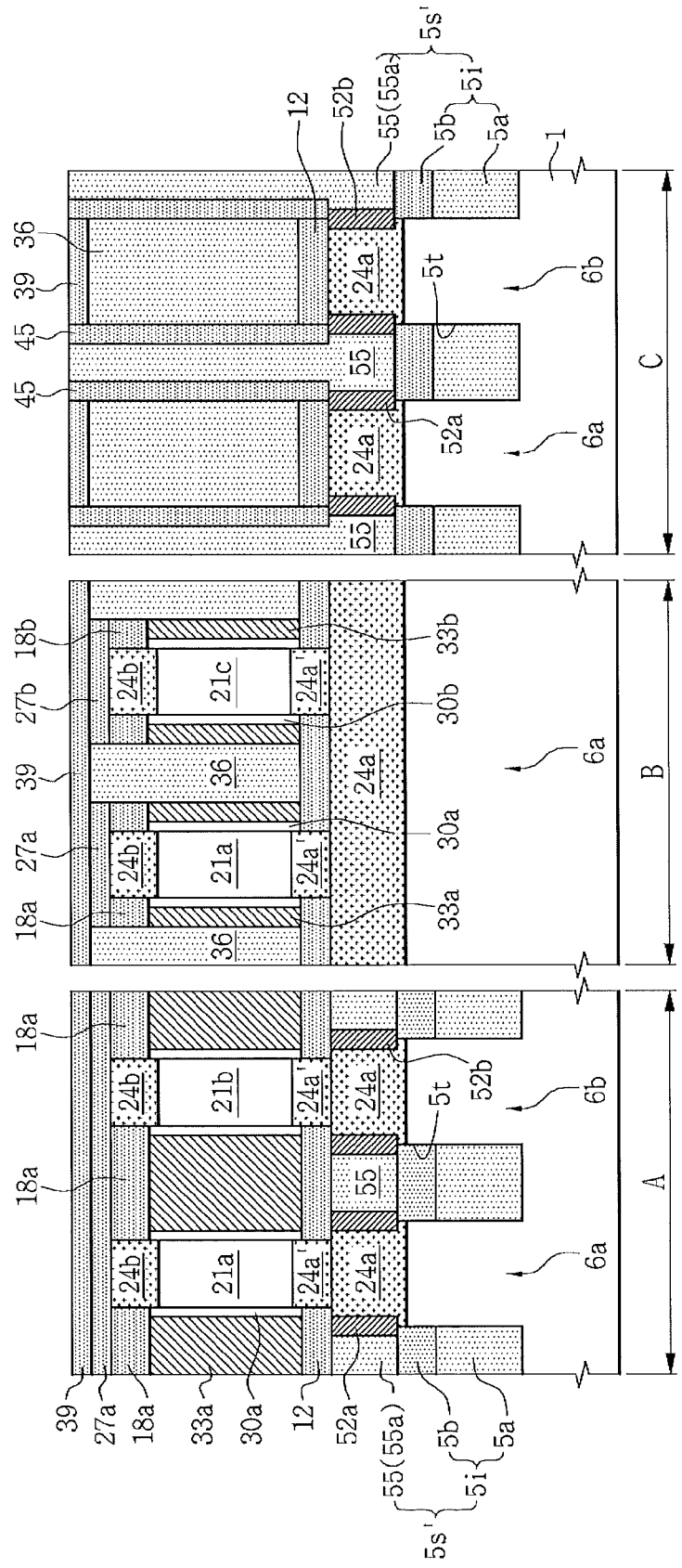

Referring to FIGS. 1 and 13, a substrate 1 may be provided. The substrate 1 may be, for example, a semiconductor wafer formed of a semiconductor material. A trench isolation region 5s' is provided in the substrate 1 to define first and second active regions 6a and 6b.

In some example embodiments, viewed from a plan view, each of the first and second active regions 6a and 6b may have a line shape.

First and third spaced-apart semiconductor pillars 21a and 21c may be provided that protrude upward from the first active region 6a. Second and fourth spaced-apart semiconductor pillars 21b and 21d may also be provided that protrude upward from the second active region 6b. The first to fourth semiconductor pillars 21a, 21b, 21c, and 21d may be formed of a single crystalline semiconductor layer. For example, the first to fourth semiconductor pillars 21a, 21b, 21c, and 21d may be formed of a single crystalline silicon layer.

Lower impurity regions 24a may be provided in upper regions of the first and second active regions 6a and 6b. The lower impurity regions 24a may be provided all over the upper surfaces of the first and second active regions 6a and 6b. In other words, the lower impurity regions 24a may be provided in the upper regions of the first and second active regions 6a and 6b so as to be disposed below the first to fourth semiconductor pillars 21a, 21b, 21c, and 21d, and may be provided in the upper regions of the first and second active regions 6a and 6b so as to be disposed around the first to fourth semiconductor pillars 21a, 21b, 21c, and 21d. Upper impurity regions 24b may be provided in the upper regions of the first to fourth semiconductor pillars 21a, 21b, 21c, and 21d.

In some example embodiments, the lower impurity regions 24a may have portions 24a' that extend from the upper regions of the first and second active regions 6a and 6b to lower regions of the first to fourth semiconductor pillars 21a, 21b, 21c, and 21d.

First and second gate masks 18a and 18b may be provided that extend to cross over the first active region 6a and the second active region 6b. The first and second gate masks 18a and 18b may be separated from each other. The first and second gate masks 18a and 18b may be in a line shape having an orientation crossing the first and second active regions 6a and 6b. The first and second gate masks 18a and 18b may be formed of an insulating material such as a silicon nitride layer.

The first gate mask 18a may be provided to surround the upper regions of the first and second semiconductor pillars 21a and 21b, and the second gate mask 18b may be provided to surround the upper regions of the third and fourth semiconductor pillars 21c and 21d. Top surfaces of the first and second gate masks 18a and 18b may be disposed on substantially the same level as the top surfaces of the first and second semiconductor pillars 21a and 21b.

In some example embodiments, a first protection pattern 27a may be provided on the first gate mask 18a, and a second protection pattern 27b may be provided on the second gate mask 18b.

A first gate line 33a may be formed below the first gate mask 18a so as to surround sidewalls of the first and second semiconductor pillars 21a and 21b. A second gate line 33b may be formed below the second gate mask 18b so as to surround sidewalls of the third and fourth semiconductor pillars 21c and 21d. The first and second gate lines 33a and 33b may be spaced apart from the first and second active regions 6a and 6b. Each of the first and second gate lines 33a and 33b may include at least one of a doped polysilicon layer, a metal layer, a metal nitride layer and a metal-semiconductor compound layer. The first gate line 33a may be vertically arranged with outer sidewalls of the first gate mask 18a. The second gate line 33b may be vertically arranged with outer sidewalls of the second gate mask 18b.

A first gate dielectric layer 30a may be interposed between the first gate line 33a and the first semiconductor pillar 21a. A second gate dielectric layer 30b may be interposed between the first gate line 33a and the second semiconductor pillar 21b. A third gate dielectric layer 30c may be interposed between the second gate line 33b and the third semiconductor pillar 21c. A fourth gate dielectric layer 30d may be interposed between the second gate line 33b and the fourth semiconductor pillar 21d.

A buffer insulating layer 12 may be disposed below the first and second gate lines 33a and 33b to cover portions of the top surfaces of the first and second active regions 6a and 6b between the first and second gate lines 33a and 33b. That is, the buffer insulating layer 12 may be interposed between the first and second gate lines 33a and 33b and the first and second active regions 6a and 6b, and may cover the top surfaces of the first and second active regions 33a and 33b disposed between the first and second gate lines 33a and 33b. The buffer insulating layer 12 may be formed of an insulating material such as a silicon nitride layer.

A first conductive pattern 52a may be provided on an upper sidewall of the first active region 6a, and a second conductive pattern 52b may be provided on an upper sidewall of the second active region 6b. The first conductive pattern 52a may be electrically connected to the lower impurity region 24a formed in the upper region of the first active region 6a, and the second conductive pattern 52b may be electrically connected to the lower impurity region 24b formed in the upper region of the second active region 6b. The first and second conductive patterns 52a and 52b may include at least one of a metal layer, a polysilicon layer, a metal nitride layer, and a metal-semiconductor compound layer. For example, the first and second conductive patterns 52a and 52b may comprise a cobalt silicide layer.

An inter-gate insulating layer 36 may be interposed between the first and second gate lines 33a and 33b, and may be disposed on the first and second active regions 6a and 6b. The inter-gate insulating layer 36 may be formed of a silicon oxide layer.

A gap fill insulating layer 55 may be provided between the first and second gate lines 33a and 33b on the trench isolation region 5s', and may be formed on the trench isolation region 5s adjacent to the inter-gate insulating layer 36. The gap fill insulating layer 55 may extend between the upper regions of the first and second active regions 6a and 6b. A portion 55a of the gap fill insulating layer 55 which extends between the upper regions of the first and second active regions 6a and 6b may constitute a part of the trench isolation region 5s'. Therefore, the trench isolation region 5s' may include an isolation insulating layer 5i that partially fills the isolation trench 5t and the portion 55a of the gap fill insulating layer 55 that fills the remaining portion of the isolation trench 5t. The isolation insulating layer 5i may include a lower isolation insulating layer 5a and an upper isolation insulating layer 5b, which are sequentially stacked. The upper isolation insulating layer 5b may be formed of a material having an etch selectivity with respect to the lower isolation insulating layer 5a.

A sidewall spacer 45 may be interposed between the inter-gate insulating layer 36 and the gap fill insulating layer 55. The sidewall spacer 45 may be formed of a silicon nitride layer, and the inter-gate insulating layer 36 and the gap fill insulating layer 55 may each comprise a silicon oxide layer.

In some example embodiments, MOSFETs using predetermined regions of the first to fourth semiconductor pillars 21a, 21b, 21c and 21d as channel regions may be provided. During operations of the MOSFET, the upper impurity regions 24b may be referred to as sources and/or as source regions, the lower impurity regions 24a may be referred to as drains and/or as drain regions, and the regions of the first to fourth semiconductor pillars 21a, 21b, 21c and 21d between the upper impurity regions 24b and the lower impurity regions 24a may be referred to as channel regions. It will be appreciated that the sources and drains may be exchanged with each other.

MOSFETs using the predetermined regions of the first and second semiconductor pillars 21a and 21b as channel regions may share the first gate line 33a, and MOSFETs using the predetermined regions of the third and fourth semiconductor pillars 21c and 21d as channel regions may share the second gate line 33b. Therefore, a flat area taken by the MOSFETs may be minimized. That is, since the flat area taken by an integrated circuit configured using the MOSFETs may be reduced, the size of a semiconductor chip and/or an electronic product employing the MOSFETs formed according to the example embodiments may be reduced.

In other example embodiments, bipolar junction transistors using predetermined regions of the first to fourth semiconductor pillars 21a, 21b, 21c and 21d as bases may be provided. During operations of the bipolar junction transistor (BJT), each upper impurity region 24b may be referred to as an emitter, each lower impurity region 24a may be referred to as a collector, and each region of the first to fourth semiconductor pillars 21a, 21b, 21c and 21d that is defined between the lower and upper impurity regions 24a and 24b may be referred to as a base. The emitter and the collector of the BJTs may be exchanged with each other. The emitter may be a node to which a low voltage is applied, and the collector may be a node to which a high voltage is applied.

In still other example embodiments, DRAM cells may be provided that use the predetermined regions of the first to fourth semiconductor pillars 21a, 21b, 21c and 21d as charge storage regions. These DRAM cells may be capacitor-less one transistor memory cells. For example, the regions of the first to fourth semiconductor pillars 21a, 21b, 21c and 21d that are disposed between the upper impurity regions 24b and the lower impurity regions 24a may be defined as charge storage regions of capacitor-less one transistor memory cells.

More specific example embodiments than the above example embodiments will be described so that one of ordinary skill in the art to which the inventive concept pertains can variously apply them to an actual device. For example, a memory device employing MOSFETs according to example embodiments described with reference to FIGS. 1 and 13 as a switching device may be provided. More specifically, referring to FIG. 14, in a structure described with reference to FIG. 13, contact plugs 57 electrically connected to the upper impurity regions 24b may be provided. The contact plugs 57 may penetrate the capping layer 39 and the first and second protection patterns 27a and 27b to be electrically connected to the upper impurity regions 24b. The contact plugs 57 may include at least one of a metal layer, a metal-semiconductor compound layer and a polysilicon layer.

Information storage elements 60 may be provided on the contact plugs 57. The information storage elements 60 may be capacitors of a DRAM. For example, the information storage elements 60 may include a lower electrode, a capacitor dielectric layer and an upper electrode. However, the present example embodiment may not be limited to the DRAM device, and may be applied to various memory devices. For example, when the present example embodiment is used for a memory device such as a PRAM, the information storage elements 60 may include a lower electrode, an information storage region formed of a phase-change material layer, and an upper electrode.

In yet other example embodiments, the lower impurity regions 24a and 24a' and/or the upper impurity regions 24b illustrated in FIGS. 13 and 14 may be changed into lower impurity regions 124a and 124a' and/or upper impurity regions 124b illustrated in FIG. 15.

Parts of the lower and/or upper impurity regions 24a, 24a' and 24b described with reference to FIGS. 13 and 14 may horizontally overlap parts of the first and second gate lines 33a and 33b (e.g., a top surface of upper impurity region 24a' is higher above the substrate 1 than are lower surfaces of the first and second gate lines 33a, 33b). However, as illustrated in FIG. 15, in further embodiments the lower impurity regions 124a and 124a' and/or the upper impurity regions 124b may not horizontally overlap the first and second gate lines 33a and 33b. That is, at least one of the lower impurity regions 124a and 124a' and the upper impurity regions 124b may not horizontally overlap the first and second gate lines 33a and 33b. Therefore, deteriorated device characteristics caused by gate induced drain leakage (GIDL) may be reduced or prevented. Also, when the example embodiments are applied to capacitor-less one transistor memory cells, greater volume of the charge storage regions of the first to fourth semiconductor pillars 21a, 21b, 21c and 21d disposed between the upper impurity regions 124b and the lower impurity regions 124a and 124a' may be ensured. Therefore, capacitor-less one transistor memory cells capable of storing more charges may be provided.

A semiconductor device according to yet another example embodiment will be described below with reference to FIGS. 16 and 21.

Figure 21:
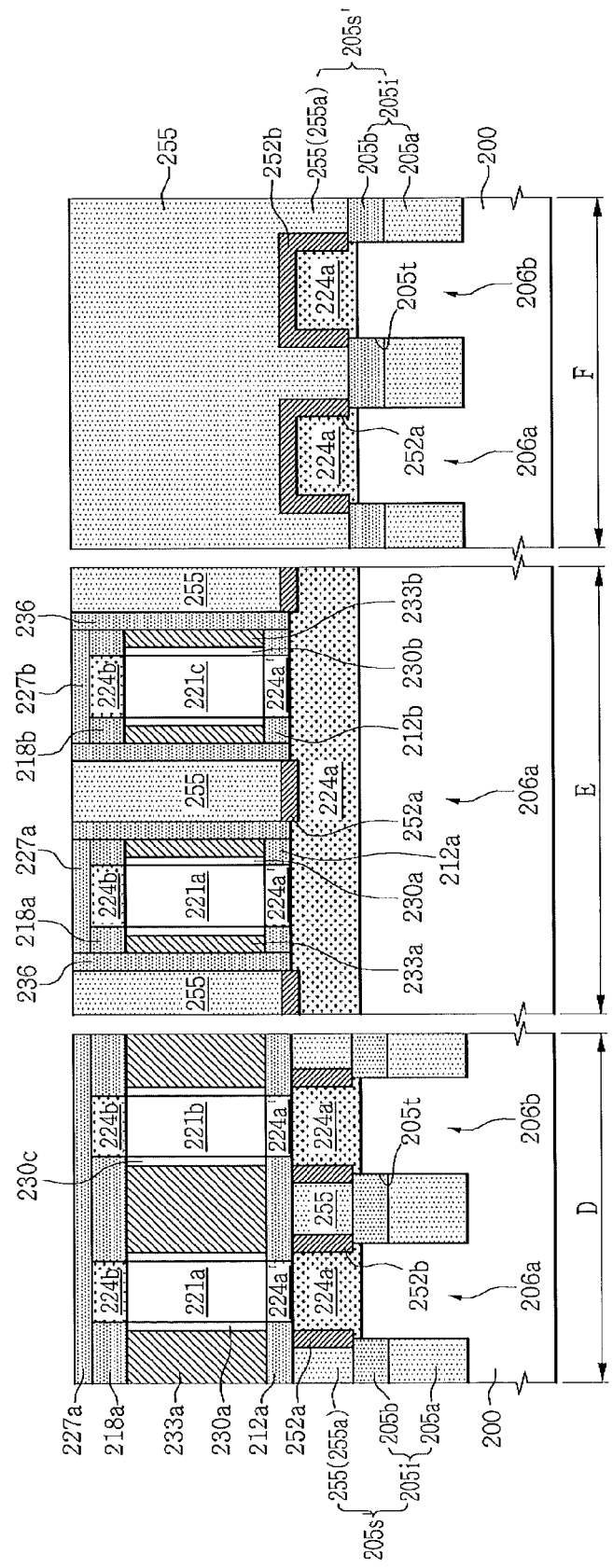

Referring to FIGS. 16 and 21, a trench isolation region 205s is provided in a substrate 200 to define first and second active regions 206a and 206b.

First and third spaced-apart semiconductor pillars 221a and 221c protrude upward from the first active region 206a. Second and fourth spaced-apart semiconductor pillars 221b and 221d protrude upward from the second active region 206b. The first to fourth semiconductor pillars 221a, 221b, 221c and 221d may be formed of, for example, a single crystalline semiconductor layer.

Lower impurity regions 224a may be provided in upper regions of the first and second active regions 206a and 206b. Upper impurity regions 224b may be provided in upper regions of the first to fourth semiconductor pillars 221a, 221b, 221c and 221d.

First and second gate masks 218a and 218b may be provided that cross over the first active region 206a and the second active region 206b. The first and second gate masks 218a and 218b may be separated from each other. The first and second gate masks 218a and 218b may be in a line shape having an orientation crossing the first and second active regions 206a and 206b. The first gate mask 218a may surround the upper regions of the first and second semiconductor pillars 221a and 221b, and the second gate mask 218b may surround the upper regions of the third and fourth semiconductor pillars 221c and 221d.

A first capping pattern 227a may be provided on the first gate mask 218a, and a second capping pattern 227b may be provided on the second gate mask 218b. Sidewalls of the first and second gate masks 218a and 218b may be vertically arranged with sidewalls of the first and second capping patterns 227a and 227b.

A first gate line 233a is formed below the first gate mask 218a and may surround sidewalls of the first and second semiconductor pillars 221a and 221b. A second gate line 233b is formed below the second gate mask 218b and may surround sidewalls of the third and fourth semiconductor pillars 221c and 221d. The first and second gate lines 233a and 233b may be separated from the first and second active regions 206a and 206b. The first gate line 233a may be vertically arranged with outer sidewalls of the first gate mask 218a. The second gate line 233b may be vertically arranged with outer sidewalls of the second gate mask 218b.

A first gate dielectric layer 230a may be interposed between the first gate line 233a and the first semiconductor pillar 221a. A second gate dielectric layer 230b may be interposed between the first gate line 233a and the second semiconductor pillar 221b. A third gate dielectric layer 230c may be interposed between the second gate line 233b and the third semiconductor pillar 221c. A fourth gate dielectric layer 230d may be interposed between the second gate line 233b and the fourth semiconductor pillar 221d.

First and second buffer patterns 212a and 212b may be provided below the first and second gate lines 233a and 233b. The first and second buffer patterns 212a and 212b may be formed of an insulating material such as a silicon nitride layer. Outer sidewalls of the first and second gate lines 233a and 233b may be vertically arranged with those of the first and second buffer patterns 212a and 212b.

As shown in FIG. 21, in some embodiments, a first conductive pattern 252a may be formed on an upper sidewall of the first active region 206a and on a top surface of the first active region 206a between the first and second buffer insulating patterns 212a and 212b. In these embodiments, a second conductive pattern 252b may be formed on an upper sidewall of the second active region 206b and on a top surface of the second active region 206b between the first and second buffer insulating patterns 212a and 212b. The first conductive pattern 252a may be in contact with the lower impurity regions 224a formed in the upper region of the first active region 206a, and the second conductive pattern 252b may be in contact with the lower impurity region 224a formed in the upper region of the second active region 206b.

In some example embodiments, as illustrated in FIG. 24, a contact conductive layer 353 may be provided on top surfaces of the first to fourth semiconductor pillars 221a, 221b, 221c and 221d. The contact conductive layer 353 may be formed of the same material as the first and second conductive patterns 252a, 352a, 252b and 352b. For example, the contact conductive layer 353 and the first and second conductive patterns 252a, 352a, 252b and 352b may be formed of a metal-semiconductor compound layer such as a cobalt silicide layer.

A gap fill insulating layer 255 may be disposed between the first and second gate lines 233a and 233b and between the upper regions of the first and second active regions 206a and 206b. The gap fill insulating layer 255 may be formed of an insulating material layer such as a silicon oxide layer. Sidewall spacers 236 may be provided between the gap fill insulating layer 255 and the first and second gate lines 233a and 233b.

A part 255a of the gap fill insulating layer 255 may fill an upper region of an isolation trench 205t separating the first and second active regions 206a and 206b. Therefore, the trench isolation region 205s' may be formed of the isolation insulating layer 205i and the portion 255a of the gap fill insulating layer 255, which are sequentially stacked in the isolation trench 205t. The isolation insulating layer 205i may include a lower isolation insulating layer 205a and an upper isolation insulating layer 205b, which are sequentially stacked. The upper isolation insulating layer 205b may be formed of a material layer having an etch selectivity with respect to the lower isolation insulating layer 205a. For example, when the lower isolation insulating layer 205a is formed of silicon oxide, the upper isolation insulating layer 205b may be formed of silicon nitride.

In some example embodiments, the lower impurity regions 224a may have portions 224a' extending from the upper regions of the first and second active regions 206a and 206b to lower regions of the first to fourth semiconductor pillars 221a, 221b, 221c and 221d. These extending portions 224a' of the lower impurity regions 224a and the upper impurity regions 224b may horizontally overlap the parts of the first and second gate lines 233a and 233b as described with reference to FIG. 13. Alternatively, at least one of the extending portions 224a' of the lower impurity regions 224a and the upper impurity regions 224b may not horizontally overlap the parts of the first and second gate lines 233a and 233b as described with reference to FIG. 15.

Methods of fabricating semiconductor devices according to the above described example embodiments will be described below.

First, a method of fabricating a semiconductor device according to one example embodiment will be described with reference to FIGS. 1 to 13.

Figure 2:
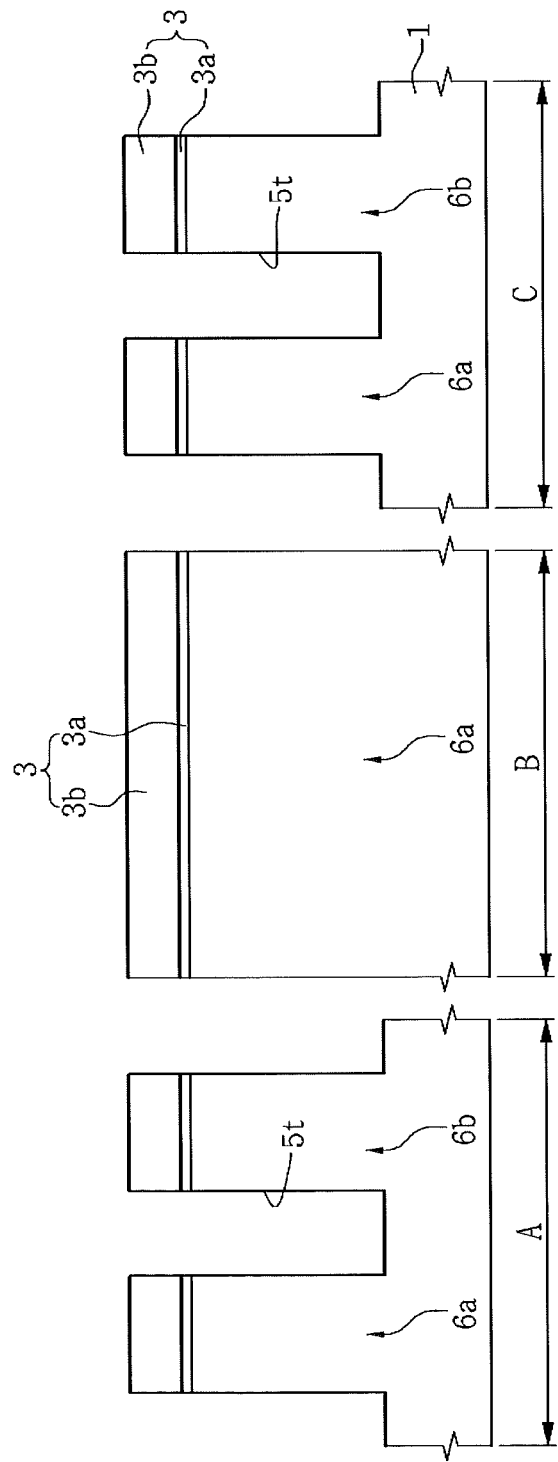
FIGS. 2 to 13 are cross-sectional views of a semiconductor device according to one example embodiment.

Referring to FIGS. 1 and 2, an isolation mask 3 may be formed on a substrate 1. The substrate 1 may be a semiconductor wafer formed of a semiconductor material such as silicon. It will be appreciated that the substrate 1 may alternatively be formed of other semiconductor materials and/or may comprise a semiconductor layer or layers that are provided on a semiconductor or non-semiconductor substrate. The isolation mask 3 may include a first isolation mask 3*a* and a second isolation mask 3*b*, which are sequentially stacked. In some embodiments, the first isolation mask 3*a* may be formed of a silicon oxide layer, and the second isolation mask 3*b* may be formed of a silicon nitride layer.

The substrate 1 may be etched using the isolation mask 3 as an etch mask to form an isolation trench 5*t*. The isolation trench 5*t* may define first and second spaced-apart active regions 6*a* and 6*b*.

In some example embodiments, each of the first and second active regions 6*a* and 6*b* may be formed in a line shape.

Figure 3:
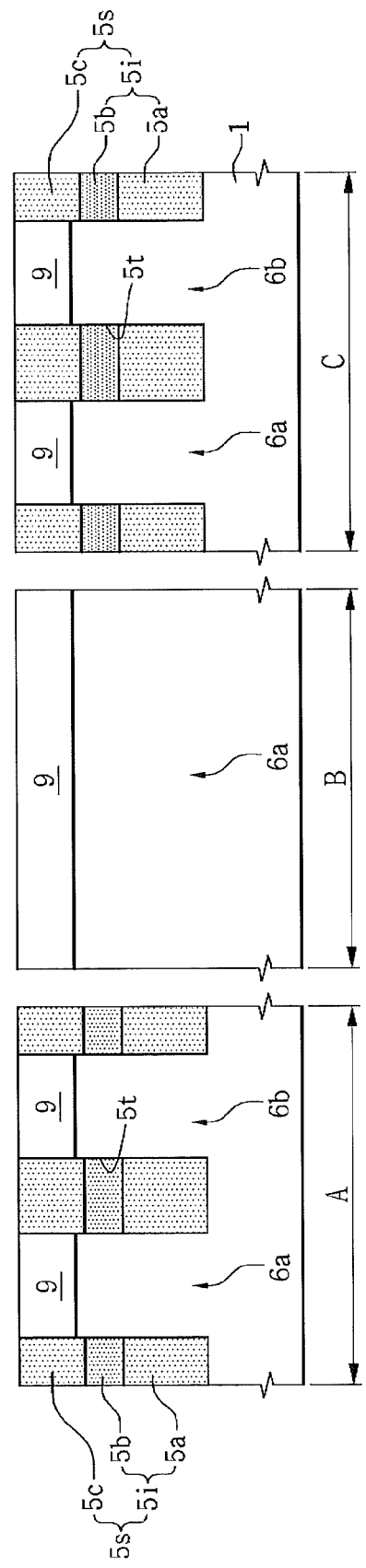

Referring to FIGS. 1 and 3, an isolation insulating layer 5*i* may be formed that partially fills the isolation trench 5*t*. A sacrificial layer 5*c* may be formed on the isolation insulating layer 5*i* that fills the remaining part of the isolation trench 5*t*. The isolation insulating layer 5*i* and the sacrificial layer 5*c* that are formed in the isolation trench 5*t* may together constitute a trench isolation region 5*s*.

The isolation insulating layer 5*i* may comprise a lower isolation insulating layer 5*a* and an upper isolation insulating layer 5*b*, which are sequentially stacked. For example, a first insulating material layer may be formed on the substrate having the isolation trench 5*t*, the first insulating material layer may be etched back to form the lower insulating layer 5*a* that partially fills the isolation trench 5*t*, a second insulating material layer may be formed on the substrate having the lower isolation insulating layer 5*a*, and the second insulating material layer may be etched back to form the upper isolation insulating layer 5*b*. The upper isolation insulating layer 5*b* may be formed of a material having an etch selectivity with respect to the lower isolation insulating layer 5*a*. For example, when the lower isolation insulating layer 5*a* is formed of silicon oxide, the upper isolation insulating layer 5*b* may be formed of silicon nitride.

The sacrificial layer 5*c* may be formed of a material having an etch selectivity with respect to the upper isolation insulating layer 5*b*. For example, when the upper isolation insulating layer 5*b* is formed of silicon nitride, the sacrificial layer 5*c* may be formed of silicon oxide. As another example, when the upper isolation insulating layer 5*b* is formed of silicon nitride or silicon oxide, the sacrificial layer 5*c* may be formed of one of amorphous carbon, polysilicon and poly SiGe.

In some example embodiments, after the sacrificial layer 5*c* is formed, the isolation mask 3 may be removed.

In other example embodiments, while the upper isolation insulating layer 5*b* is formed, the second isolation mask 3*b* may be removed, and while the sacrificial layer 5*c* is formed, the first isolation mask 3*a* may be removed. For example, an insulating material layer for forming the upper isolation insulating layer 5*b* may be formed on the substrate having the lower isolation insulating layer 5*a*, and the second isolation mask 3*b* may be etched and removed while the insulating material layer is etched-back. Further, a material layer for forming the sacrificial layer 5*c* may be formed on the substrate having the upper isolation insulating layer 5*b*, and the first isolation mask 3*b* may be etched and removed while the material layer is etched-back.

Impurity ions may be implanted into the first and second active regions 6*a* and 6*b*, so that a first preliminary impurity region 9 may be formed. The first preliminary impurity region 9 may be formed by forming the trench isolation region 5*s*, and then implanting impurity ions into the first and second active regions 6*a* and 6*b*. Alternatively, the first preliminary impurity region 9 may be formed by implanting impurity ions into the substrate 1 before forming the isolation mask 3 described in FIG. 2.

Figure 4:
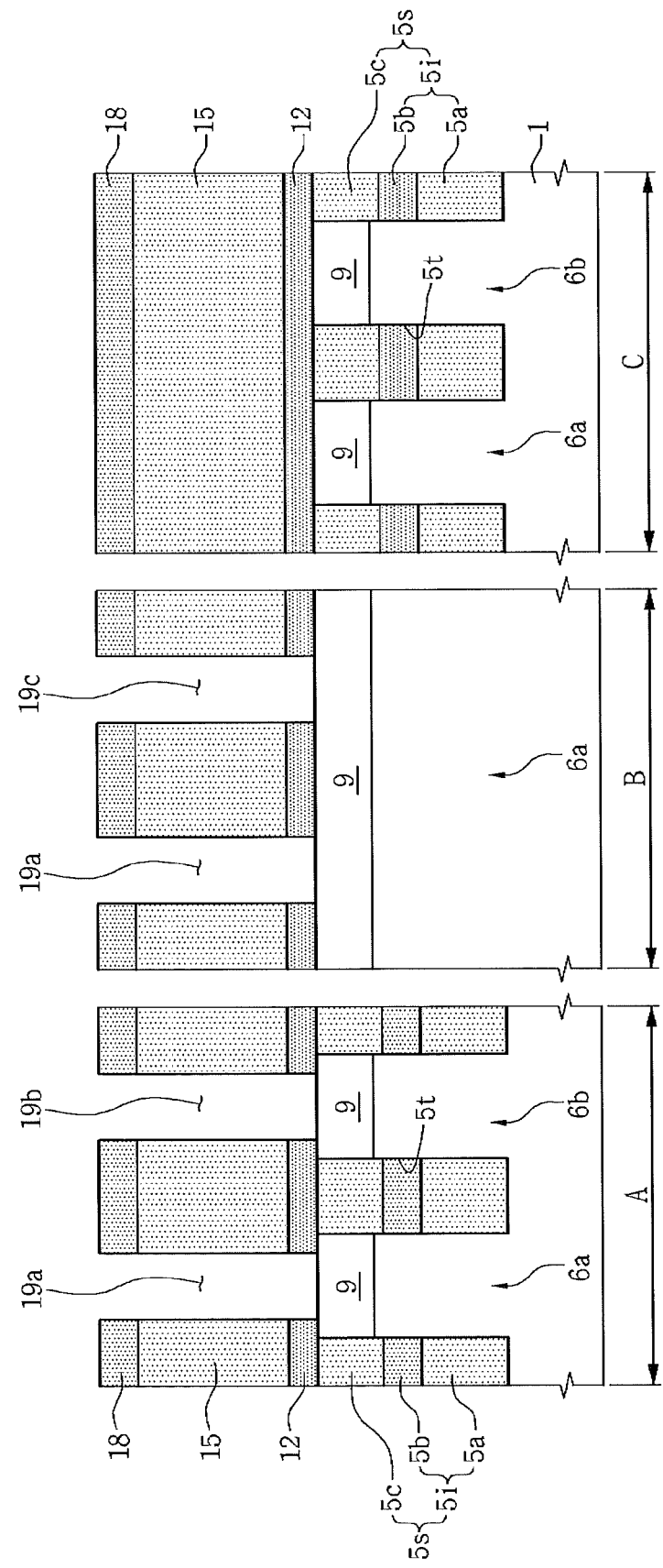

Referring to FIGS. 1 and 4, a buffer insulating layer 12 may be formed on the substrate having the trench isolation region 5*s*. The buffer insulating layer 12 may be formed of a material having an etch selectivity with respect to the sacrificial layer 5*c*. For example, when the sacrificial layer 5*c* is formed of silicon oxide, the buffer insulating layer 12 may be formed of silicon nitride.

An intermediate material layer 15 may be formed on the buffer insulating layer 12. The intermediate material layer 15 may be formed of a material having an etch selectivity with respect to the buffer insulating layer 12. For example, when the buffer insulating layer 12 is formed of silicon nitride, the intermediate material layer 15 may be formed of silicon oxide.

A gate mask layer 18 may be formed on the intermediate material layer 15. The gate mask layer 18 may be formed of a material having an etch selectivity with respect to the intermediate material layer 15. For example, when the intermediate material layer 15 is formed of silicon oxide, the gate mask layer 18 may be formed of silicon nitride.

The buffer insulating layer 12, the intermediate material layer 15 and the gate mask layer 18, which are sequentially stacked, may be patterned to form spaced-apart first and third holes 19*a* and 19*c* that expose predetermined regions of the first active region 6*a*, and to form spaced-apart second and fourth holes 19*b* and 19*d* that expose predetermined regions of the second active region 6*b*. Thus, the first to fourth holes 19*a*, 19*b*, 19*c* and 19*d* penetrate the buffer insulating layer 12, the intermediate material layer 15 and the gate mask layer 18 to expose predetermined regions of the first and second active regions 6*a* and 6*b*.

Figure 5:
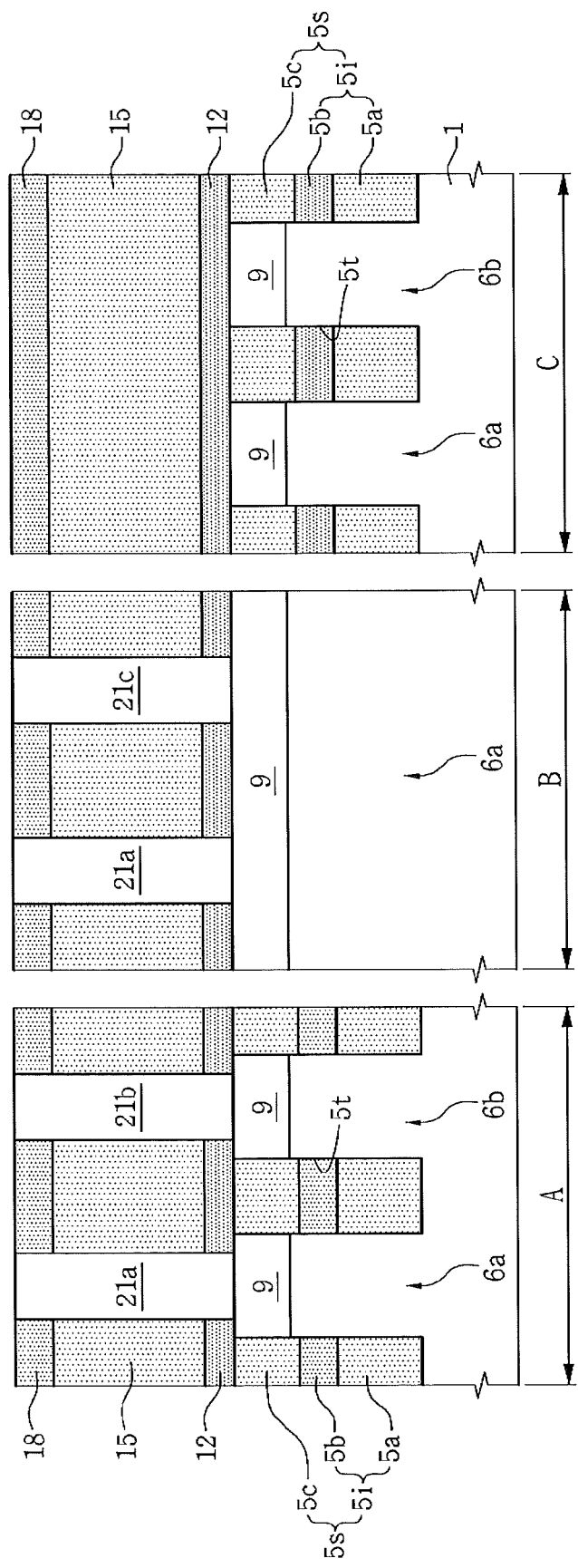

Referring to FIGS. 1 and 5, first to fourth semiconductor pillars 21*a*, 21*b*, 21*c* and 21*d* may be formed that fill the first to fourth holes 19*a*, 19*b*, 19*c* and 19*d*, respectively. As shown in FIG. 5, the first to fourth semiconductor pillars 21*a*, 21*b*, 21*c* and 21*d* may be formed to have top surfaces disposed on substantially the same level as that of the gate mask layer 18.

In some example embodiments, the formation of the first to fourth semiconductor pillars 21*a*, 21*b*, 21*c* and 21*d* may include performing a selectivity epitaxial growth (SEG) process on the substrate having the first to fourth holes 19*a*, 19*b*, 19*c* and 19*d* to fill the first to fourth holes 19*a*, 19*b*, 19*c* and 19*d* with single crystalline silicon. Alternatively, the formation of the first to fourth semiconductor pillars 21*a*, 21*b*, 21*c* and 21*d* may include filling the first to fourth holes 19*a*, 19*b*, 19*c* and 19*d* with amorphous silicon or polysilicon, and irradiating with a laser beam to melt the amorphous silicon or polysilicon filling the first to fourth holes 19*a*, 19*b*, 19*c* and 19*d* to recrystallize the silicon in an amorphous or poly structure into silicon having a single crystalline structure.

In other example embodiments, the first to fourth semiconductor pillars 21*a*, 21*b*, 21*c* and 21*d* may be formed using solid phase epitaxy (SPE), metal induced crystallization (MIC) or metal induced lateral crystallization (MILC).

Figure 6:
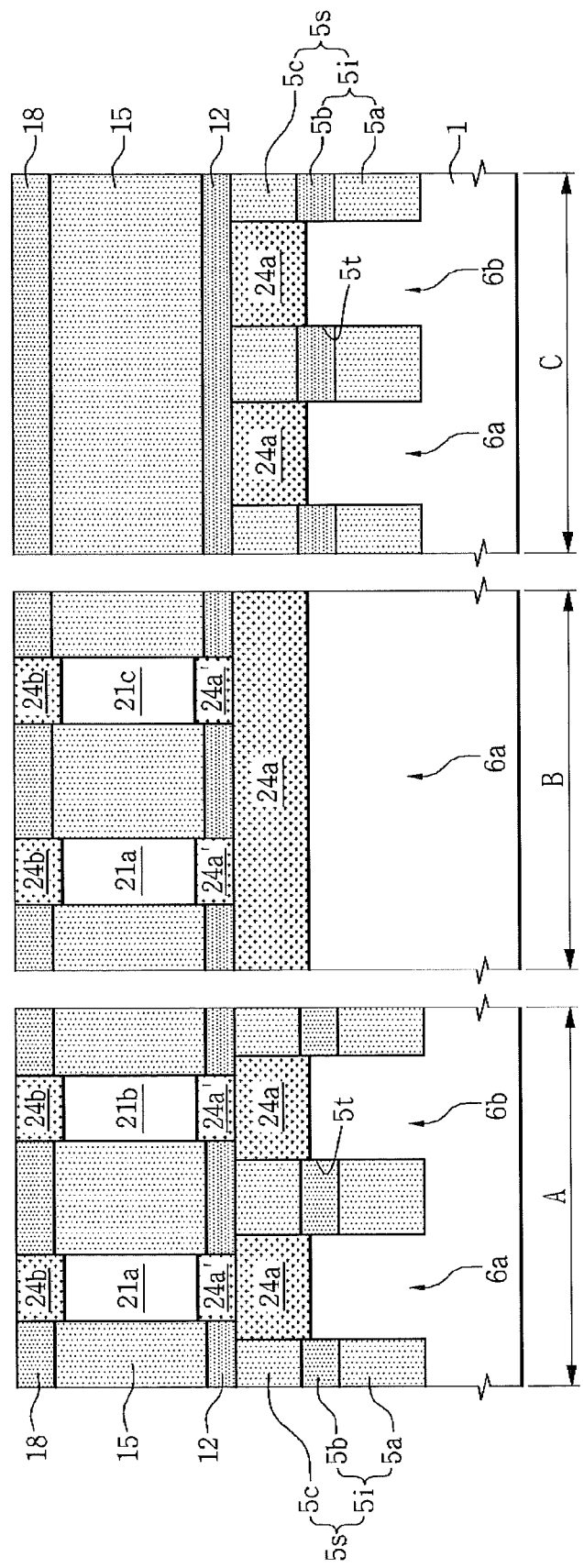

Referring to FIGS. 1 and 6, impurity ions may be implanted into the upper regions of the first to fourth semiconductor pillars 21*a*, 21*b*, 21*c* and 21*d* to form a second preliminary impurity region.

An annealing process may be performed in order for impurities in the first preliminary impurity region 9 and the second preliminary impurity region to be activated, so that lower impurity regions 24a and upper impurity regions 24b may be formed. During this annealing process, the impurities in the first preliminary impurity region 9 may be diffused into the lower regions of the first to fourth semiconductor pillars 21a, 21b, 21c and 21d. Moreover, the impurities in the second preliminary impurity region may be diffused to form upper impurity regions 24b in the upper regions of the first to fourth semiconductor pillars 21a, 21b, 21c and 21d.

In some example embodiments, portions 24a' diffused into the first to fourth semiconductor pillars 21a, 21b, 21c and 21d among the lower impurity regions 24a and 24a' may horizontally overlap a part of the intermediate material layer 15. In addition, the upper impurity regions 24b may horizontally overlap a part of the intermediate material layer 15.

In other example embodiments, the portions 24a' diffused into the first to fourth semiconductor pillars 21a, 21b, 21c and 21d among the lower impurity regions 24a and 24a' may not horizontally overlap a part of the intermediate material layer 15. In some embodiments, the upper impurity regions 24b may also not horizontally overlap a part of the intermediate material layer 15.

Figure 7:
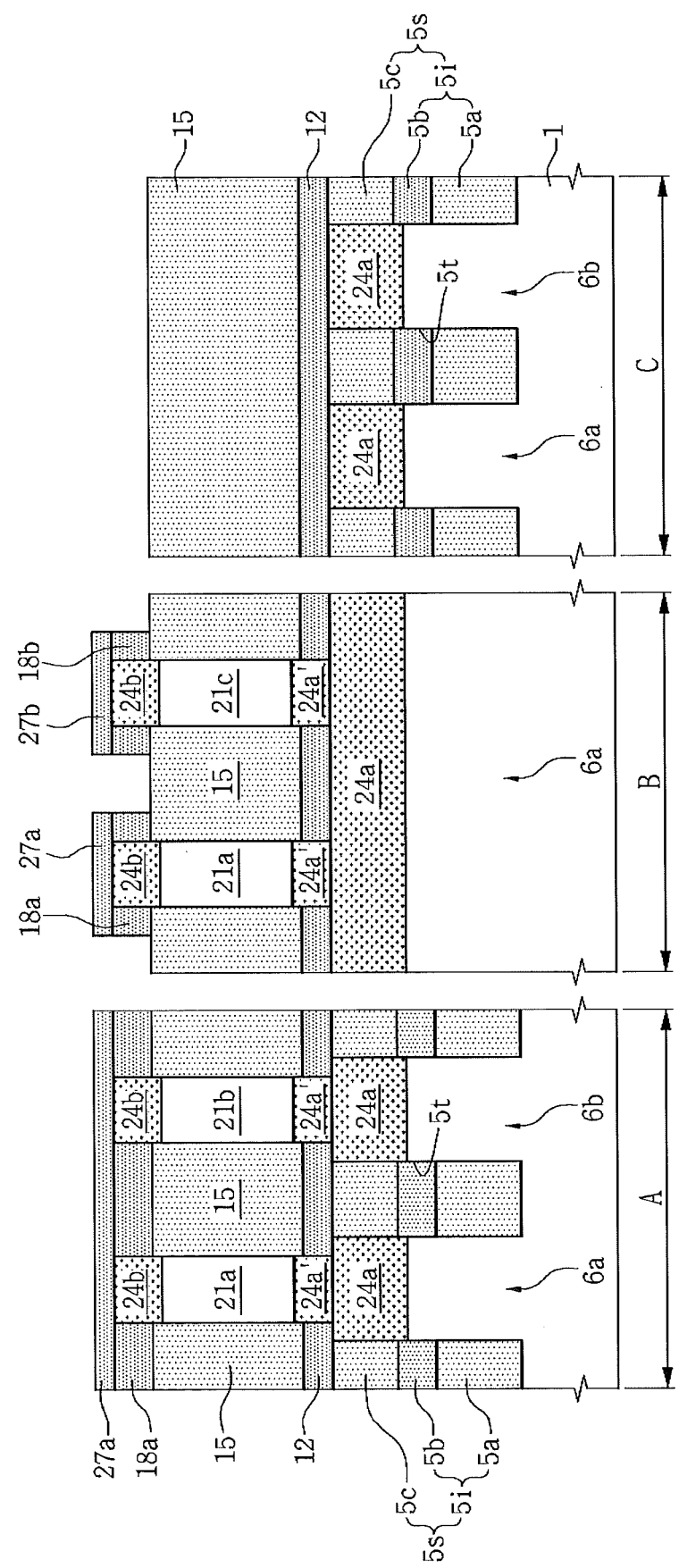

Referring to FIGS. 1 and 7, a protection material layer may be formed on the substrate having the lower and upper impurity regions 24a and 24b. The protection material layer may comprise, for example, a silicon nitride layer.

The protection material layer and the gate mask layer (18 of FIG. 6) may be patterned to form a first gate mask 18a surrounding the upper regions of the first and second semiconductor pillars 21a and 21b, and to form a first protection pattern 27a that covers the first gate mask 18a and the first and second semiconductor pillars 21a and 21b. A second gate mask 18b surrounding the upper regions of the third and fourth semiconductor pillars 21c and 21d may be formed, and a second protection pattern 27b that covers the second gate mask 18b and the third and fourth semiconductor pillars 21c and 21d may be formed while the first gate mask 18a and the first protection pattern 27a are formed.

Viewed from a plan view, the first and second gate masks 18a and 18b and the first and second protection patterns 27a and 27b may be formed in the shape of a line having an orientation crossing the first and second active regions 6a and 6b. Therefore, each of the first and second gate masks 18a and 18b may extend to cross over the first active region 6a and the second active region 6b, respectively.

As a result of forming the first and second gate masks 18a and 18b and the first and second protection patterns 27a and 27b, predetermined regions of the intermediate material layer 15 may be exposed. That is, the intermediate material layer 15 disposed between the spaced-apart first and second protection patterns 27a and 27b may be exposed.

Figure 8:
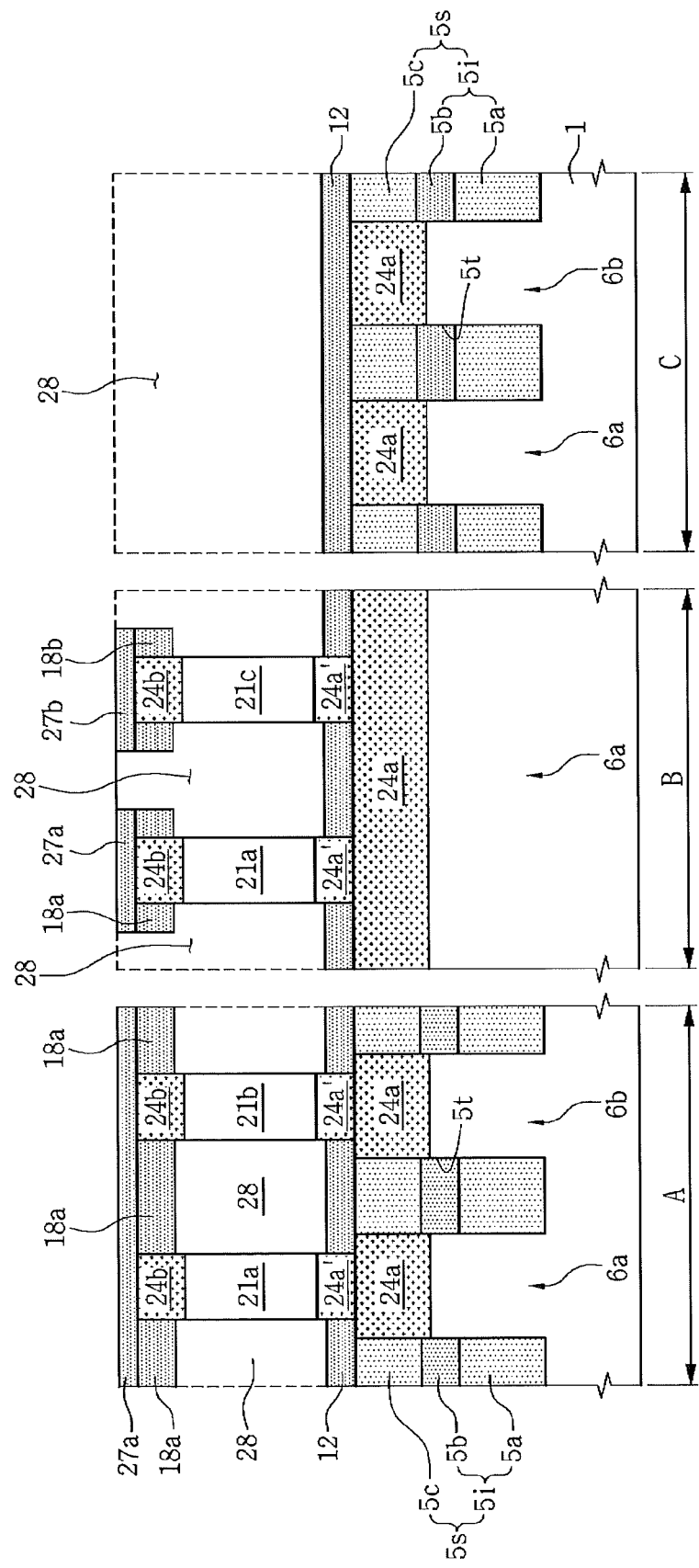

Referring to FIGS. 1 and 8, the exposed intermediate material layer 15 may be selectively removed by, for example, etching. For example, the intermediate material layer 15 may be etched and removed using the first and second protection patterns 27a and 27b, the first to fourth semiconductor pillars 21a, 21b, 21c and 21d and the buffer insulating layer 12 as etch masks. Therefore, as a result of removing the intermediate material layer 15, a hollow space 28 may be formed. The hollow space 28 may expose predetermined regions of the sidewalls of the first to fourth semiconductor pillars 21a, 21b, 21c and 21d.

Figure 9:
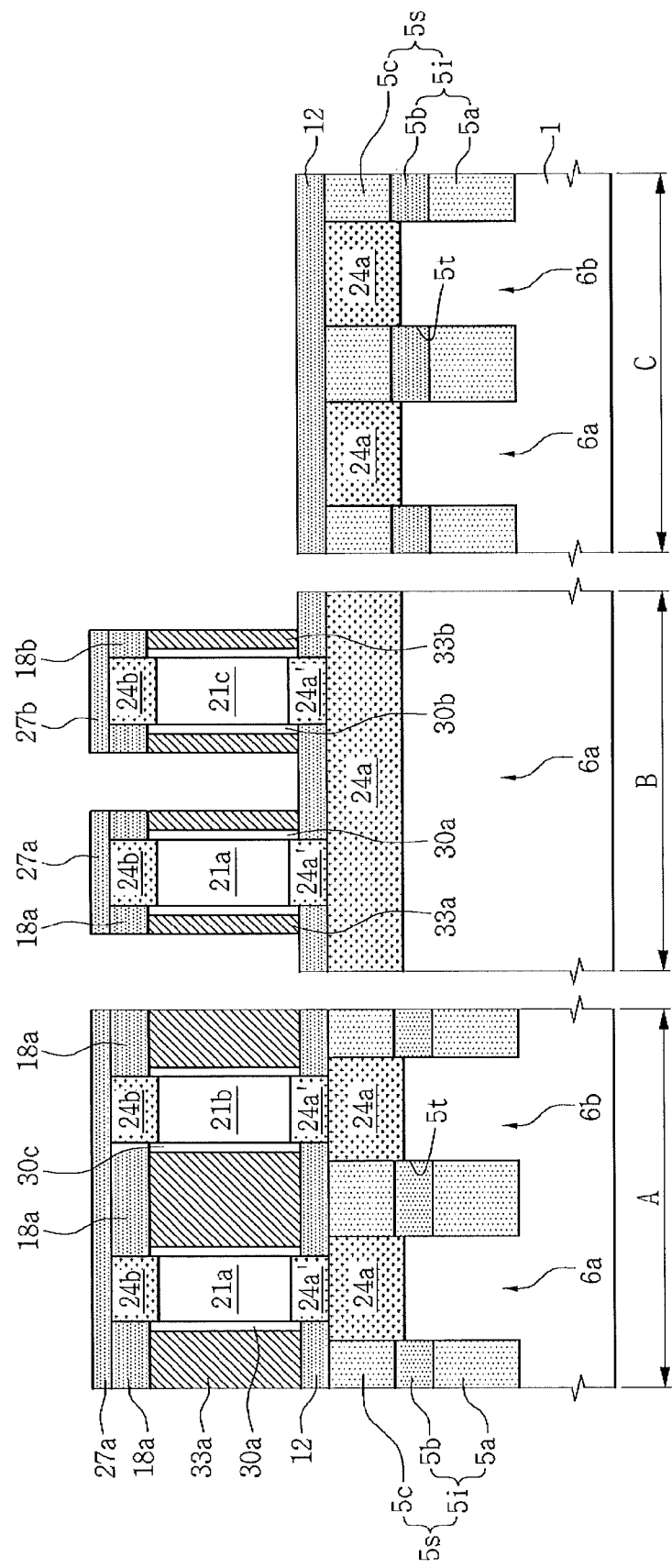

Referring to FIGS. 1 and 9, first to fourth gate dielectric layers 30a, 30b, 30c and 30d may be formed on the sidewalls of the first to fourth semiconductor pillars 21a, 21b, 21c and 21d that are exposed by the hollow space (28 of FIG. 8). The first to fourth gate dielectric layers 30a, 30b, 30c and 30d may be thermal oxide layers. In other exemplary embodiments, the first to fourth gate dielectric layers 30a, 30b, 30c and 30d may be high-k dielectric layers having a greater dielectric constant than a silicon oxide layer.

A gate conductive layer may be formed on the substrate having the first to fourth gate dielectric layers 30a, 30b, 30c and 30d. This gate conductive layer may be etched using the first and second gate masks 18a and 18b and the first and second protection patterns 27a and 27b as etch masks. The gate conductive layer may be etched by performing an anisotropic etching process. As a result, a first gate line 33a may be formed below the first gate mask 18a, and a second gate line 33b may be formed below the second gate mask 18b. The first gate line 33a may be formed to surround the sidewalls of the first and second semiconductor pillars 21a and 21b, and the second gate line 33b may be formed to surround the sidewalls of the third and fourth semiconductor pillars 21c and 21d. The first gate line 33a may be vertically arranged with outer sidewalls of the first gate mask 18a. The second gate line 33b may likewise be vertically arranged with outer sidewalls of the second gate mask 18b.

The first gate dielectric layer 30a may be interposed between the first gate line 33a and the first semiconductor pillar 21a, the second gate dielectric layer 30b may be interposed between the first gate line 33a and the second semiconductor pillar 21b, the third gate dielectric layer 30c may be interposed between the second gate line 33b and the third semiconductor pillar 21c, and the fourth gate dielectric layer 30d may be interposed between the second gate line 33b and the fourth semiconductor pillar 21d.

Figure 10:
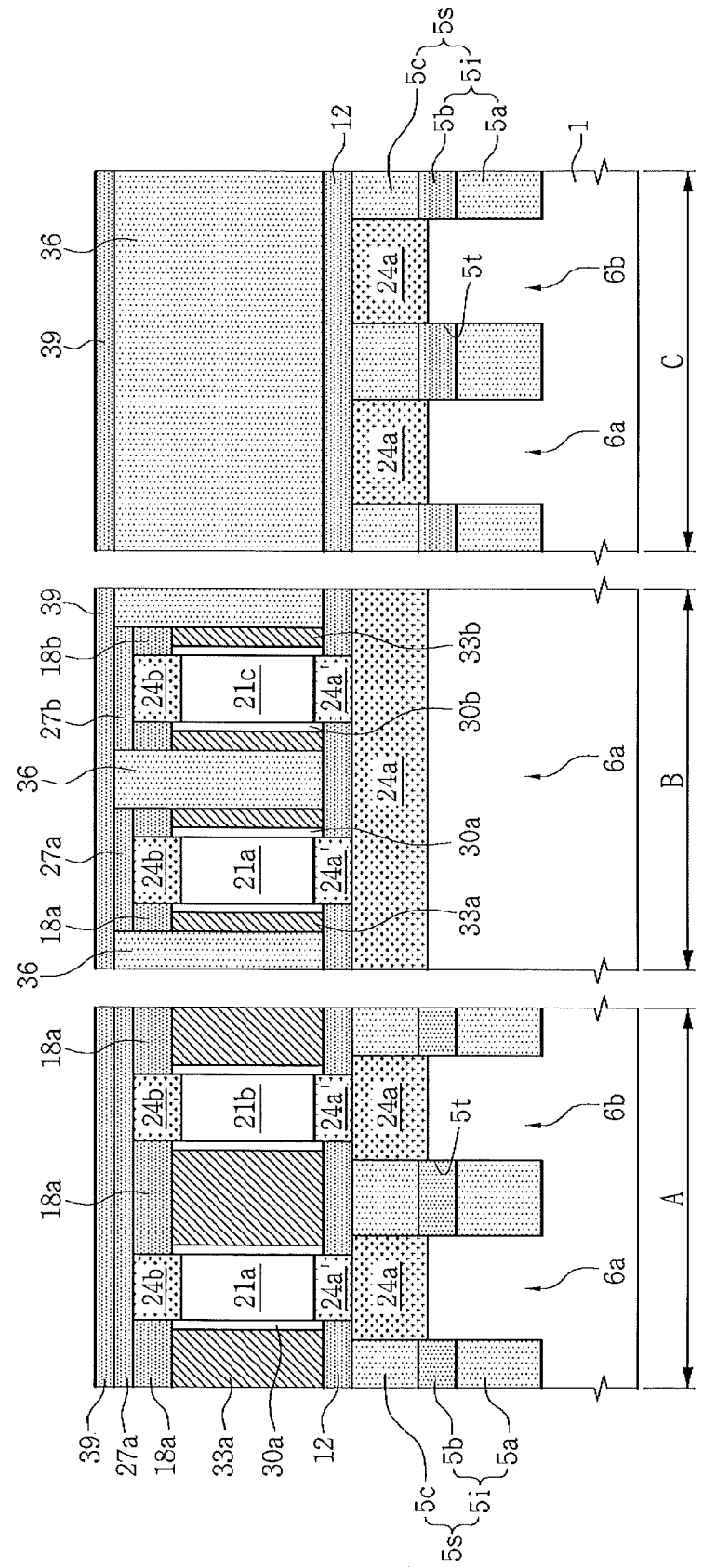

Referring to FIGS. 1 and 10, an inter-gate insulating layer 36 may be formed to fill a space between the first and second gate lines 21a and 21b. The inter-gate insulating layer 36 may be a silicon oxide layer. The formation of the inter-gate insulating layer 36 may include forming an insulating material layer on the substrate having the first and second gate lines 21a and 21b, and planarizing the insulating material layer until top surfaces of the first and second protection patterns 27a and 27b are exposed.

A capping layer 39 may be formed to cover the first and second protection patterns 27a and 27b and the inter-gate insulating layer 36. The capping layer 39 may be formed of a material having an etch selectivity with respect to the sacrificial layer 5c. For example, when the sacrificial layer 5c is formed of silicon oxide, the capping layer 39 may be formed of silicon nitride.

Figure 11:
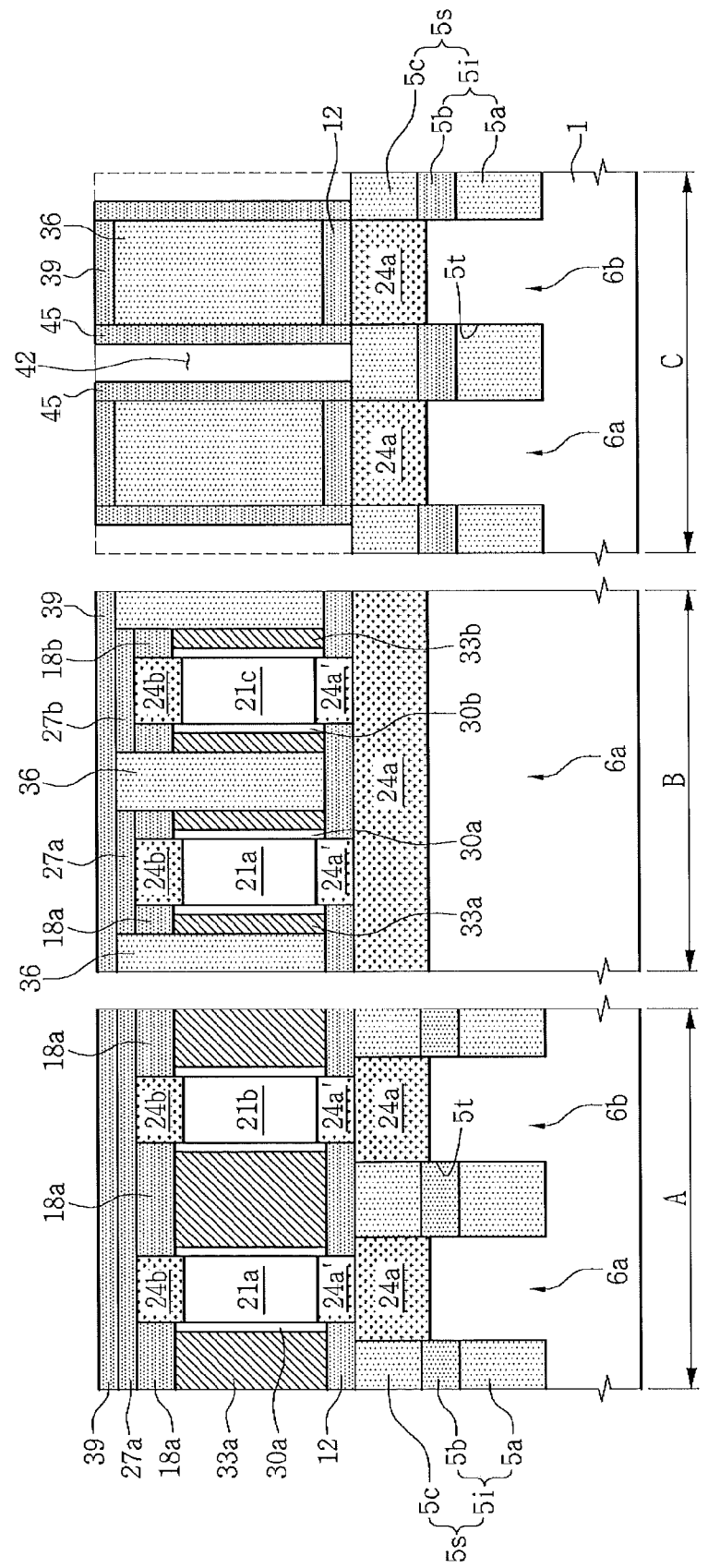

Referring to FIGS. 1 and 11, the capping layer 39, the inter-gate insulating layer 36 and the buffer insulating layer 12 may be patterned to form openings 42 exposing predetermined regions of the sacrificial layer 5c. Each of the openings 42 may be disposed between the first and second gate lines 33a and 33b, and may be disposed between the first and second active regions 6a and 6b. That is, the openings 42 may expose the sacrificial layer 5c of the trench isolation region 5s disposed between the first to fourth semiconductor pillars 21a, 21b, 21c and 21d.

Sidewall spacers 45 may be formed on sidewalls of the openings 42. The sidewall spacers 45 may be formed of a material having an etch selectivity with respect to the sacrificial layer 5c. For example, when the sacrificial layer 5c is formed of silicon oxide, the sidewall spacers 45 may be formed of silicon nitride.

The sidewall spacers 45, the capping layer 39, the buffer insulating layer 12 and the isolation insulating layer 5b may be formed of a material having an etch selectivity with respect to the sacrificial layer 5c.

Figure 12:
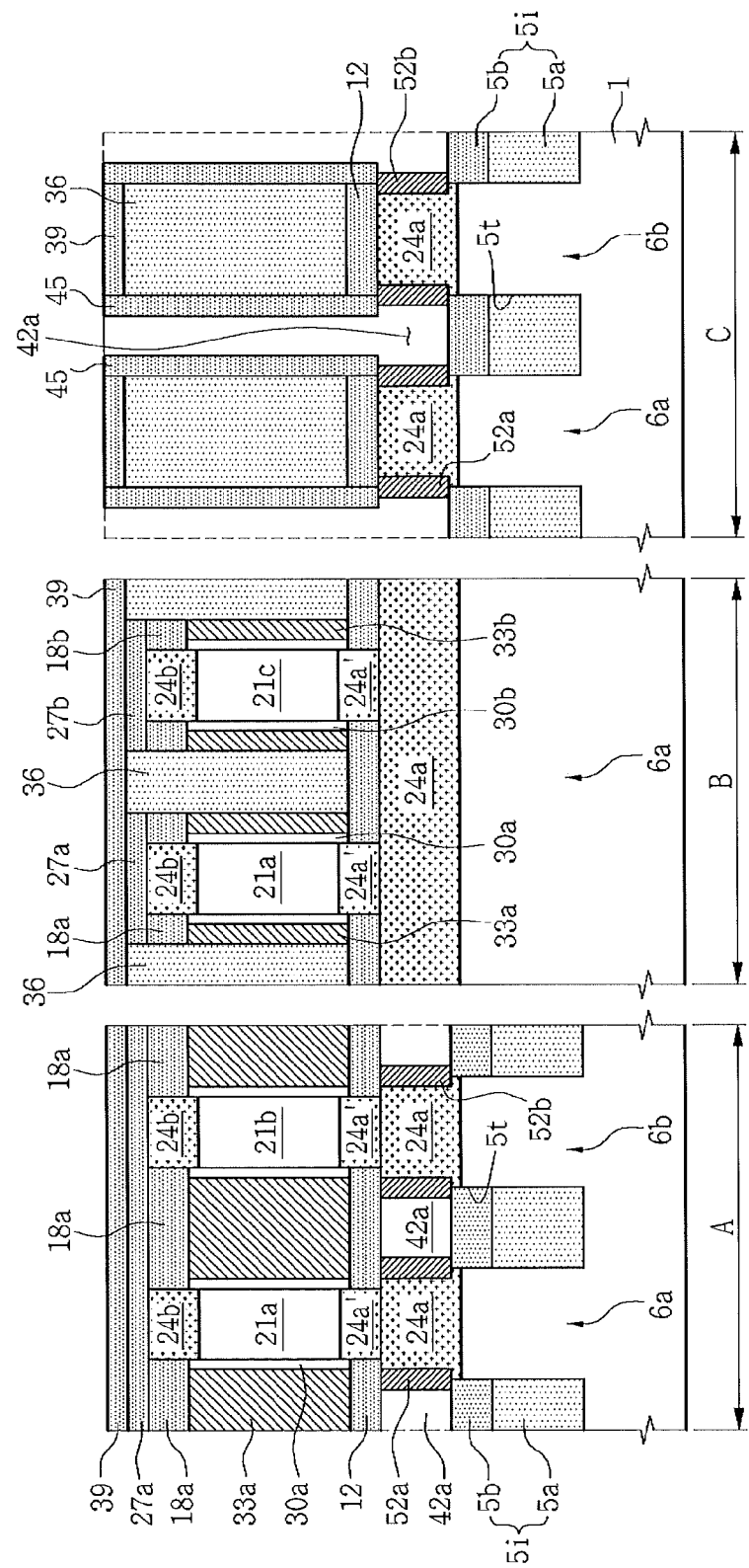

Referring to FIGS. 1 and 12, the exposed sacrificial layer (5c of FIG. 11) may be removed by selective etching. For example, when the capping layer 39, the sidewall spacers 45, the buffer insulating layer 12 and the upper isolation insulating layer 5b are formed of a material having an etch selectivity with respect to the sacrificial layer (5c of FIG. 11), the sacrificial layer (5c of FIG. 11) may be selectively removed using an isotropic etching process. Therefore, as a result of removing the sacrificial layer (5c of FIG. 11), upper sidewalls of the first and second active regions 6a and 6b may be exposed, and the opening 42 of FIG. 11 is expanded to create an opening 42a (see FIG. 12).

Afterwards, a first conductive pattern 52a may be formed on the exposed upper sidewall of the first active region 6a, and a second conductive pattern 52b may be formed on the exposed upper sidewall of the second active region 6b. The first conductive pattern 52a may be in contact with the lower impurity regions 24a formed in the upper region of the first active region 6a, and the second conductive pattern 52b may be in contact with the lower impurity region 24b formed in the upper region of the second active region 6b.

Each of the first and second conductive patterns 52a and 52b may be formed of at least one of a metal layer, a doped polysilicon layer, a metal nitride layer, and a metal-semiconductor compound layer. For example, the formation of the first and second conductive patterns 52a and 52b may include forming a metal material layer on the substrate from which the sacrificial layer (5c of FIG. 11) is selectively etched, performing a silicide annealing process thereon to react the first and second active regions 6a and 6b with the metal material layer so that metal-semiconductor compounds are formed on the upper sidewalls of the first and second active regions 6a and 6b, and removing a metal material layer that does not react. The metal-semiconductor compounds may be formed of materials such as nickel silicide, titanium silicide, cobalt silicide, and tungsten silicide.

Referring to FIGS. 1 and 13, a gap fill insulating layer 55 may be formed to fill the extending openings (42a of FIG. 12). Therefore, a part 55a of the gap fill insulating layer 55 may fill the space formed as a result of removing the sacrificial layer (5c of FIG. 11). In particular, the part 55a of the gap fill insulating layer 55 may fill in the opening between the upper regions of the first and second active regions 6a and 6b. Thus, the part 55a of the gap fill insulating layer 55 that fills the opening between the upper regions of the first and second active regions 6a and 6b may constitute a part of the final trench isolation region 5s'. The gap fill insulating layer 55 may be formed of an insulating material layer such as silicon oxide.

More specific example embodiments will now be described that provide examples as to how embodiments of the present invention can be applied to various devices. For example, a method of fabricating a memory device employing MOSFETs fabricated according to the example embodiments described with reference to FIGS. 2 to 13 as a switching device will be described below.

Referring to FIG. 14, MOSFETs fabricated according to the example embodiments described with reference to FIGS. 2 to 13 may be prepared. Contact plugs 57 may be formed that penetrate the capping layer 39 and the first and second protection patterns 27a and 27b to electrically connect to the upper impurity regions 24b formed in upper regions of the first to fourth semiconductor pillars 21a, 21b, 21c and 21d. Each of the contact plugs 57 may be formed of at least one of a doped polysilicon layer, a metal layer, a metal nitride layer and a metal-semiconductor compound layer.

Information storage elements 60 may be formed on the contact plugs 57. The information storage elements 60 may be capacitors of a DRAM. For example, the information storage elements 60 may include a lower electrode, a capacitor dielectric layer and an upper electrode. However, the present example embodiment is not limited to the DRAM device and may be applied to various memory devices. For example, when the present example embodiment is used for a memory device such as a PRAM, the information storage elements 60 may include a lower electrode, an information storage means formed of a phase change material layer and an upper electrode.

The inventive disclosure is not limited to the above-described example embodiment, and may be embodied in other forms. For example, the lower impurity regions 24a and 24a' and/or the upper impurity regions 24b illustrated in FIGS. 13 and 14 may be replaced instead with the lower impurity regions 124a and 124a' and/or the upper impurity regions 124b illustrated in FIG. 15. The lower impurity regions 24a and 24a' and parts of the upper impurity regions 24b in the above-described example embodiments may horizontally overlap parts of the first and second gate lines 33a and 33b. However, as illustrated in FIG. 15, at least one of the lower impurity regions 124a and 124a' and the upper impurity regions 124b may be formed not to horizontally overlap the first and second gate lines 33a and 33b. For example, during the process of forming the first preliminary impurity region 9 described in FIG. 3, an impurity concentration distribution in the first preliminary impurity region 9 may be adjusted, so that the lower impurity regions 124a and 124a' may be formed not to horizontally overlap the first and second gate lines 33a and 33b. More specifically, the impurity concentration distribution may be controlled such that impurities are distributed in an upper region of the first preliminary impurity region 9 described in FIG. 3 at a low concentration, and impurities are distributed in an intermediate or lower region of the first preliminary impurity region 9 at a high concentration. The impurity concentration distribution may be formed by adjusting ion implantation energy during an ion implantation process. When an annealing process described with respect to FIG. 6 is performed on the first preliminary impurity region 9 having impurities of a low concentration in the upper region, the portions 124a' diffused from the lower impurity regions 124a formed in the upper regions of the first and second active regions 6a and 6b into the first to fourth semiconductor pillars 21a, 21b, 21c and 21d may not horizontally overlap the first and second gate lines 33a and 33b.

When the ion implantation energy during the ion implantation process for forming the upper impurity regions 24b is controlled, the upper impurity regions 24b may not horizontally overlap the first and second gate lines 33a and 33b.

Next, a method of fabricating a semiconductor device according to other example embodiments will be described below with reference to FIGS. 16 to 21.

Figure 17:
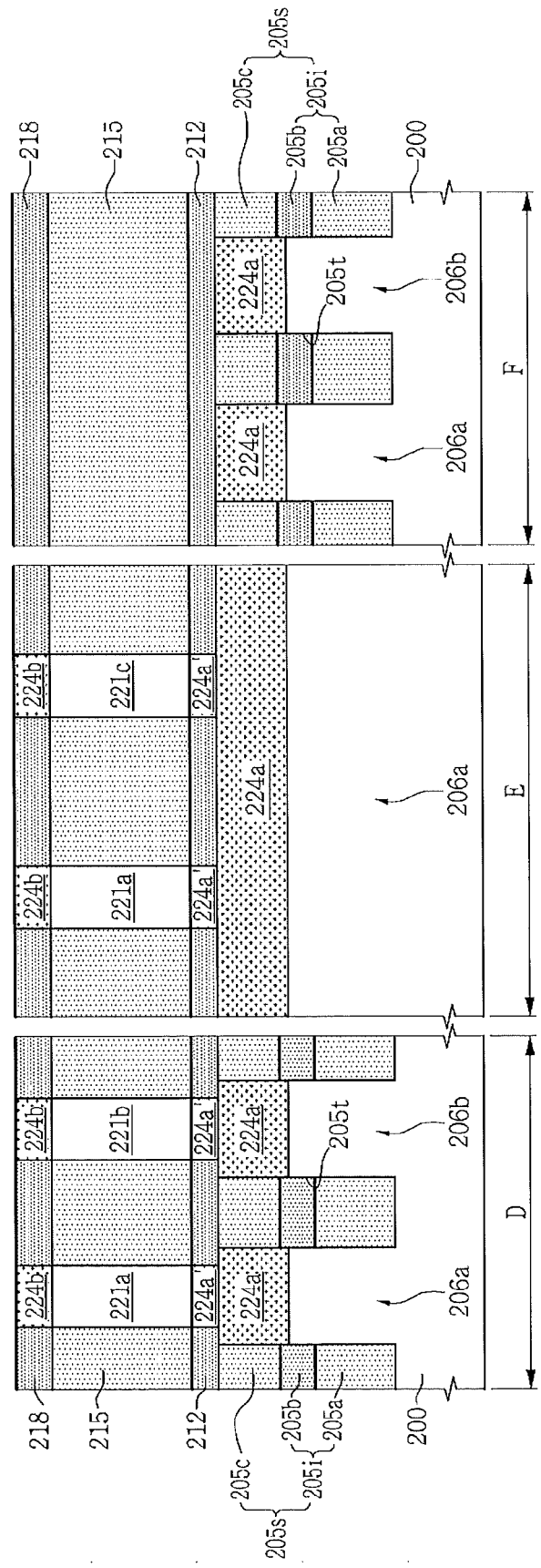
FIGS. 17 to 21 are cross-sectional views of a semiconductor device according to yet another example embodiment.

Referring to FIGS. 16 and 17, as described with reference to FIGS. 2 and 3, a trench isolation region 205s defining first and second active regions 206a and 206b may be formed in a substrate 200. The trench isolation region 205s may include an isolation insulating layer 205i that partially fills the trench isolation region 205s and a sacrificial layer 205c that fills the remaining portion of the isolation trench 205t on the isolation insulating layer 205i. As described with reference to FIG. 3, the isolation insulating layer 205i may be formed of a lower isolation insulating layer 205a and an upper isolation insulating layer 205b, which are sequentially stacked. The sacrificial layer 205c may be formed of a material having an etch selectivity with respect to the upper isolation insulating layer 205b. As described with reference to FIG. 3, impurity ions may be implanted into the first and second active regions 206a and 206b to form a first preliminary impurity region.

As described with reference to FIG. 4, a buffer insulating layer 212, an intermediate material layer 215 and a gate mask layer 218 may be formed on the substrate having the trench isolation region 205s. The intermediate material layer 215 may be formed of a material having an etch selectivity with respect to the buffer insulating layer 212 and the gate mask layer 218. For example, when the gate mask layer 218 and the buffer insulating layer 212 are formed of silicon nitride, the intermediate material layer 215 may be formed of silicon oxide. As described with reference to FIG. 4, the buffer insulating layer 212, the intermediate material layer 215 and the gate mask layer 218, which are sequentially stacked, may be patterned to form spaced-apart first and third holes 219a and 219c that expose predetermined regions of the first active regions 206a, and to form spaced-apart second and fourth holes 219b and 219d that expose predetermined regions of the second active region 206b.

As described with reference to FIG. 5, first to fourth semiconductor pillars 221a, 221b, 221c and 221d may be formed that fill the first to fourth holes 219a, 219b, 219c and 219d, respectively.

As described with reference to FIG. 6, impurity ions may be implanted into the upper regions of the first to fourth semiconductor pillars 221a, 221b, 221c and 221d to form a second preliminary impurity region. An annealing process may be performed to activate impurities in the first and second preliminary region to form lower impurity regions 224a and 224a' and upper impurity regions 224b.

In some example embodiments, during the annealing process, the impurities in the first preliminary impurity region may be activated in the upper regions of the first and second active regions 206a and 206b, and may be diffused into the lower regions of the first to fourth semiconductor pillars 221a, 221b, 221c and 221d. Therefore, the lower impurity regions 224a and 224a' may include the regions formed in the upper regions of the first and second active regions 206a and 206b, and regions 224a' formed in the lower regions of the first to fourth semiconductor pillars 221a, 221b, 221c and 221d.

Figure 18:
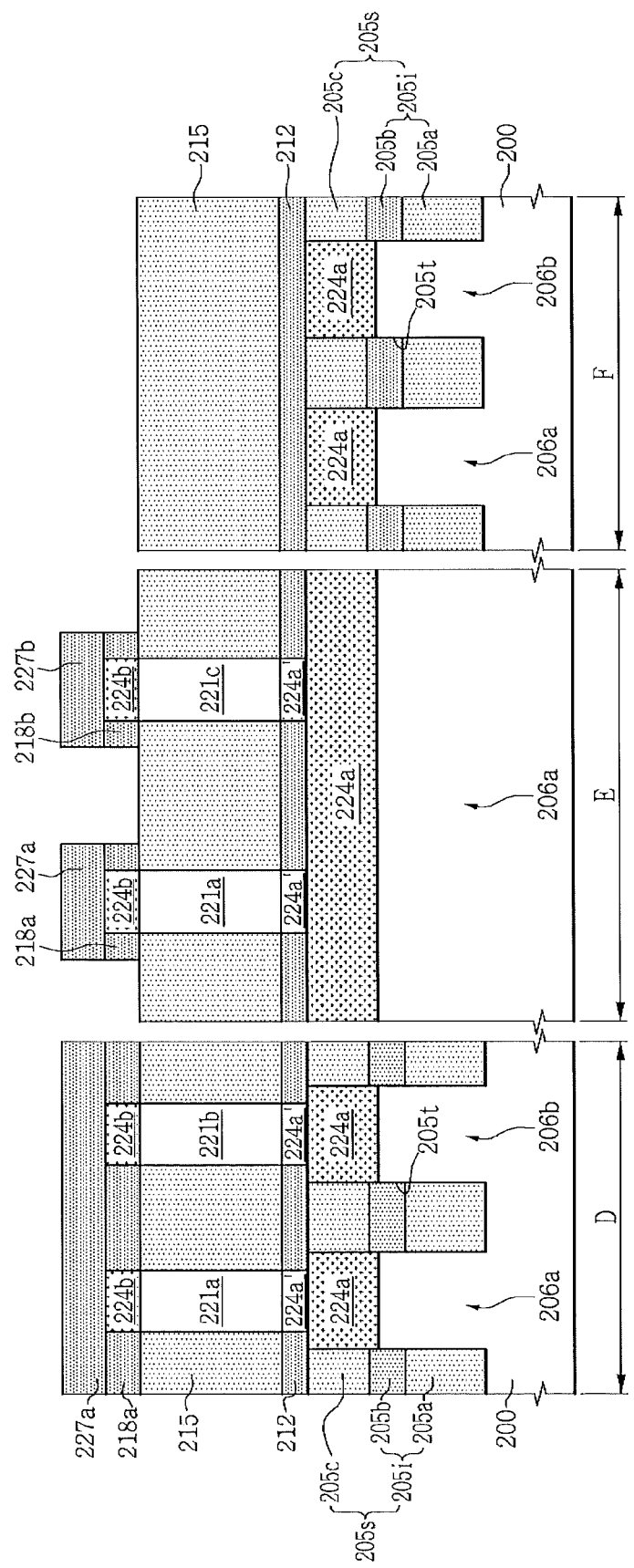

Referring to FIGS. 16 and 18, a capping layer may be formed on the substrate having the lower and upper impurity regions 224a and 224b. The capping layer may be formed of a material having an etch selectivity with respect to the sacrificial layer 205c. For example, when the sacrificial layer 205c is formed of silicon oxide, the capping layer may be formed of silicon nitride.

The capping layer and the gate mask layer (218 of FIG. 17) may be patterned to form a first gate mask 218a that surrounds the upper regions of the first and second semiconductor pillars 221a and 221b, and to form a first capping pattern 227a that covers the first gate mask 218a and the first and second semiconductor pillars 221a and 221b.

While the first gate mask 218a and the first capping pattern 227a are formed, a second gate mask 218b that surrounds the upper regions of the third and fourth semiconductor pillars 221c and 221d may be formed, and a second capping pattern 227b covering the second gate mask 218b and the third and fourth semiconductor pillars 221c and 221d may be formed.

Viewed from a plan view, the first and second gate masks 218a and 218b and the first and second capping patterns 227a and 227b may be formed in the shape of a line having an orientation crossing the first and second active regions 206a and 206b.

The first and second gate masks 218a and 218b may be formed to cross over the first active region 206a, and to extend upward from the second active region 206b. Further, the first and second gate masks 218a and 218b may be formed to have sidewalls vertically arranged with those of the first and second capping patterns 227a and 227b.

As a result of forming the first and second gate masks 218a and 218b and the first and second capping patterns 227a and 227b, predetermined regions of the intermediate material layer 215 between the first and second capping patterns 227a and 227b may be exposed.

Figure 19:
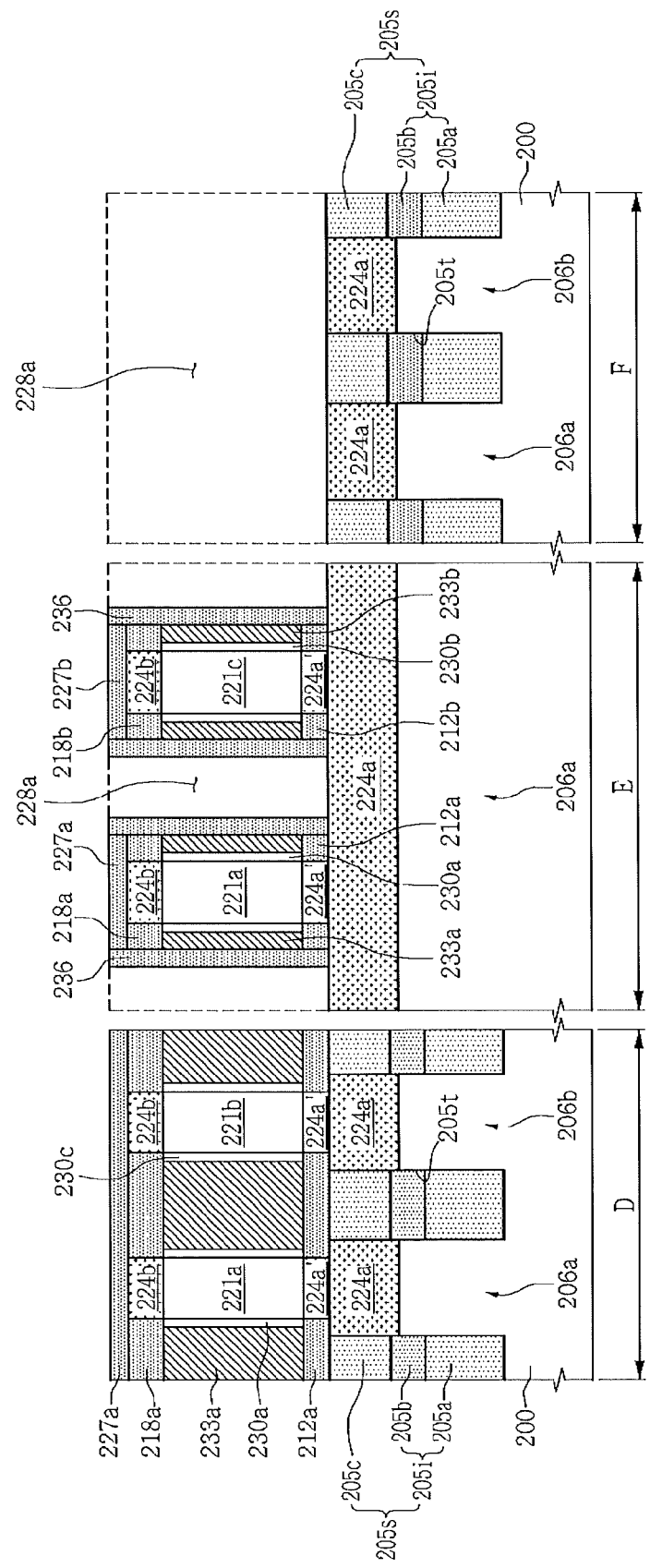

Referring to FIGS. 16 and 19, and as was described above with reference to FIG. 8, the intermediate material layer 215 may be selectively removed to expose the sidewalls of the first to fourth semiconductor pillars 221a, 221b, 221c and 221d, thereby forming a hollow space 228a. First to fourth gate dielectric layers 230a, 230b, 230c and 230d may be formed on the sidewalls of the first to fourth semiconductor pillars 221a, 221b, 221c and 221d.

A gate conductive layer may be formed on the substrate having the first to fourth gate dielectric layers 230a, 230b, 230c and 230d, and the gate conductive layer may be etched using the first and second capping patterns 227a and 227b as etch masks. The gate conductive layer may be etched using an anisotropic etching process. As a result, a first gate line 233a may be formed below the first gate mask 218a, and a second gate line 233b may be formed below the second gate mask 218b. The first gate line 233a may be formed to surround the sidewalls of the first and second semiconductor pillars 221a and 221b, and the second gate line 233b may be formed to surround the sidewalls of the third and fourth semiconductor pillars 221c and 221d. The first gate line 233a may be vertically arranged with outer sidewalls of the first gate mask 218a, and the second gate line 233b may be vertically arranged with outer sidewalls of the second gate mask 218b.

Afterwards, the buffer insulating layer 212 may be etched such that the buffer insulating layer 212 may remain below the first and second gate lines 233a and 233b. As a result, a self-aligned first buffer insulating pattern 212a may be formed below the first gate line 233a, and a self-aligned second buffer insulating pattern 212b may be formed below the second gate line 233b. Therefore, the first buffer insulating pattern 212a may be formed to have a sidewall that is vertically aligned with the sidewall of the first gate line 233a, and the second buffer insulating pattern 212b may be formed to have a sidewall that is vertically aligned with the sidewall of the second gate line 233b. While the buffer insulating layer 212 is etched, heights of the first and second capping patterns 227a and 227b may be lowered.

As a result of forming the first and second buffer insulating patterns 212a and 212b, the sacrificial layer 205c disposed between the first and second buffer insulating patterns 212a and 212b may be exposed, and top surfaces of the first and second active regions 206a and 206b that are disposed between the first and second buffer insulating patterns 212a and 212b may be exposed.

Sidewall spacers 236 may be formed on sidewalls of the first and second buffer insulating patterns 212a and 212b, the first and second gate lines 233a and 233b, the first and second gate masks 218a and 218b, and the first and second capping patterns 227a, 227b. The sidewall spacers 236 may be formed of a material having an etch selectivity with respect to the sacrificial layer 205c. For example, when the sacrificial layer 205c is formed of silicon oxide, the sidewall spacers 236 may be formed of silicon nitride.

Figure 20:
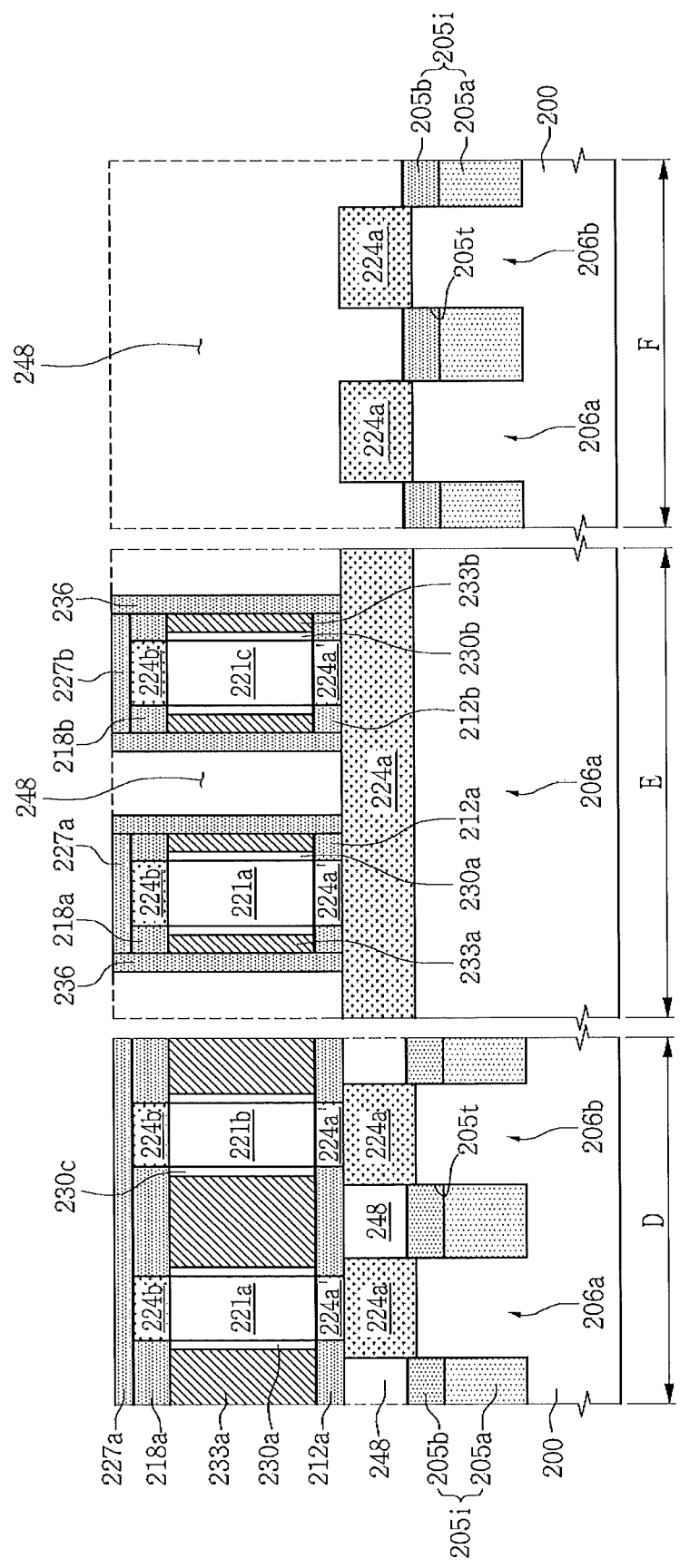

Referring to FIGS. 16 and 20, the exposed sacrificial layer (205c of FIG. 19) may be selectively removed using an isotropic etching process to expose the upper sidewalls of the first and second active regions 6a and 6b. Therefore, a hollow space 248 may be formed that exposes the upper sidewalls of the first and second active regions 6a and 6b and the top surfaces of the first and second active regions 206a and 206b that are disposed between the first and second buffer insulating patterns 212a and 212b.

Referring to FIGS. 16 and 21, a first conductive pattern 252a may be formed on a top surface of the first active region 206a that is disposed between the upper sidewall of the first active region 206a and the first and second buffer insulating patterns 212a and 212b, and a second conductive pattern 252b may be formed on a top surface of the second active region 206b that is disposed between the upper sidewall of the second active region 206b and the first and second buffer insulating patterns 212a and 212b.

The first conductive pattern 252a may be in contact with the lower impurity regions 224a formed in the upper region of the first active region 206a, and the second conductive pattern 252b may be in contact with the lower impurity region 224a formed in the upper region of the second active region 206b.

Each of the first and second conductive patterns 252a and 252b may be formed of at least one of a metal layer, a doped polysilicon layer, a metal nitride layer and a metal-semiconductor compound layer. For example, the formation of the first and second conductor patterns 252a and 252b may include forming a metal material layer on the substrate from which the sacrificial layer (205c of FIG. 19) is selectively etched, performing a silicide annealing process, reacting the first and second active regions 206a and 206b with the metal material layer to form metal-semiconductor compounds on top surfaces of the first and second active regions 206a and 206b disposed between the upper sidewalls of the first and second active regions 206a and 206b and the first and second buffer insulating patterns 212a and 212b, and removing a metal layer that does not react.

An insulating material layer may be formed on the substrate having the first and second conductive patterns 252a and 252b, and the insulating material layer may be planarized, so that a gap fill insulating layer 255 may be formed. The gap fill insulating layer 255 may fill a space between the first and second gate lines 233a and 233b, and fill between the upper regions of the first and second active regions 206a and 206b. The gap fill insulating layer 255 may be formed of an insulating material layer such as silicon oxide.

The isolation trench 205t may be filled with the isolation insulating layer 205i and the part 255a of the gap fill insulating layer 255, which are sequentially stacked. Therefore, the part 255a of the gap fill insulating layer 255 filling the space between the upper regions of the first and second active regions 206a and 206b and the isolation insulating layer 205i may constitute the final trench isolation region 205s'.

Next, a method of fabricating a semiconductor device according to still other example embodiments will be described with reference to FIGS. 16, and 22 to 24.

Referring to FIGS. 16 and 22, a substrate on which up to the first and second gate lines 233a and 233b described with reference to FIG. 20 are formed may be prepared. The buffer insulating layer (212 of FIG. 19) may be etched to form first and second buffer patterns 312a and 312b below the first and second gate lines 233a and 233b. As a result of forming the first and second buffer patterns 312a and 312b, top surfaces of the sacrificial layer (205c of FIG. 19) disposed between the first and second buffer patterns 312a and 312b and the top surfaces of the first and second active regions 206a and 206b may be exposed.

Sidewall spacers 336 may be formed on the sidewalls of the first and second gate lines 233a and 233b. Then, the sacrificial layer 205c may be selectively removed using an isotropic etching process to form a hollow space 348 between the first and second gate lines 233a and 233b and between the first and second gate lines 233a and 233b and the isolation insulating layer 205i.

In some example embodiments, while the buffer insulating layer (212 of FIG. 19) is etched in order to form the first and second buffer patterns 312a and 312b, the first and second capping patterns (227a and 227b of FIG. 19) may be removed to expose the top surfaces of the first to fourth semiconductor pillars 221a, 221b, 221c and 221d.

In other example embodiments, the first and second capping patterns (227a and 227b of FIG. 19) may be selectively removed, and the top surfaces of the first to fourth semiconductor pillars 221a, 221b, 221c and 221d may be exposed. For example, when the first and second capping patterns (227a and 227b of FIG. 19) are formed of an amorphous carbon layer and/or a polysilicon layer, and the sidewall spacers 336 and the first and second gate masks 218a and 218b are formed of an insulating material layer, the first and second capping patterns (227a and 227b of FIG. 19) may be selectively etched and removed.

In still other example embodiments, while the sacrificial layer 205c is removed, the first and second capping patterns (227a and 227b of FIG. 19) are removed as well, so that the top surfaces of the first to fourth semiconductor pillars 221a, 221b, 221c and 221d may be exposed.

As a result, the top surfaces of the first and second active regions 206a and 206b disposed between the first and second buffer patterns 312a and 312b and the upper sidewalls of the first and second active regions 206a and 206b may be exposed, and the top surfaces of the first to fourth semiconductor pillars 221a, 221b, 221c and 221d may be exposed as well.

Referring to FIGS. 16 and 23, a metal layer may be formed on the substrate in which the top surfaces of the first and second active regions 206a and 206b that are between the first and second gate lines 333a and 333b, the upper sidewalls of the first and second active regions 206a and 206b and the top surfaces of the first to fourth semiconductor pillars 221a, 221b, 221c and 221d are exposed, a silicide annealing process may be performed to form metal-semiconductor compound layers, e.g., cobalt silicide layers, and portions of the metal layer that does not react may be removed.

A metal-semiconductor compound layer formed on the top surface of the first active region 206a disposed between the first and second buffer patterns 312a and 312b and the upper sidewall of the first active region 206 may be defined as a first conductive pattern 352a, and a metal-semiconductor compound layer formed on the top surface of the second active region 206b disposed between the first and second buffer patterns 312a and 312b and on the upper sidewall of the second active region 206b may be defined as a second conductive pattern 352b. Further, metal-semiconductor compound layers formed on the top surfaces of the first to fourth semiconductor pillars 221a, 221b, 221c and 221d may be defined as contact conductive layers 353.

Referring to FIGS. 16 and 24, a planarized gap fill insulating layer 355 may be formed on the substrate having the first and second conductive patterns 352a and 352b and the contact conductive layers 353. The gap fill insulating layer 355 may fill a space between the first and second gate lines 233a and 233b and may fill between the upper regions of the first and second active regions 206a and 206b. The gap fill insulating layer 355 may be formed of an insulating material such as silicon oxide.

The isolation trench 205t may be filled with the isolation insulating layer 205i and a part 355a of the gap fill insulating layer 355, which are sequentially stacked. Therefore, the part 355a of the gap fill insulating layer 355 filling between the upper regions of the first and second active regions 206a and 206b and the isolation insulating layer 205i may form the final trench isolation region 305s'.

According to example embodiments, since a discrete device such as a metal oxide semiconductor field effect transistor (MOSFET) or a bipolar junction transistor (BJT) can be formed using semiconductor pillars, a flat area of an integrated circuit employing the discrete circuit can be reduced. Therefore, the size of a product such as a semiconductor chip or an electronic part formed using the discrete device can be reduced.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
a substrate;
a trench isolation region on the substrate that defines first and second spaced-apart active regions;
a first semiconductor pillar protruding upward from the first active region;
a second semiconductor pillar protruding upward from the second active region;
a first gate mask extending to cross over the first and second active regions, the first gate mask surrounding upper portions of sidewalls of the first and second semiconductor pillars; and
a first gate line below the first gate mask, the first gate line being spaced-apart from the first and second active regions, the first gate line surrounding parts of the sidewalls of the first and second semiconductor pillars.

2. The device of claim 1, further comprising:
a second gate line;
a first conductive pattern formed on an upper sidewall of the first active region and formed on a top surface of the first active region that is between the first gate line and the second gate line; and
a second conductive pattern formed on an upper sidewall of the second active region, and formed on a top surface of the second active region that is between the first gate line and the second gate line.

3. The device of claim 2, further comprising:
a first impurity region provided in the first active region adjacent to the first conductive pattern; and
a second impurity region provided in the second active region adjacent to the second conductive pattern.

4. The device of claim 3, further comprising:
a third impurity region provided in an upper region of the first semiconductor pillar; and
a fourth impurity region provided in an upper region of the second semiconductor pillar.

5. The device of claim 4, wherein an upper portion of the first gate line is coplanar with an upper portion of the third impurity region and an upper portion of the fourth impurity region.

6. The device of claim 1, wherein the first gate line has a sidewall that is vertically aligned with a sidewall of the first gate mask.

7. The device of claim 1, further comprising a buffer insulating layer between the first gate line and the first and second active regions.

8. The device of claim 1, further comprising a buffer insulating pattern formed below the first gate line, wherein the buffer insulating pattern has a sidewall that is vertically aligned with a sidewall of the first gate line.

9. The device of claim 1, further comprising:
a third semiconductor pillar protruding upward from the first active region, the third semiconductor pillar being spaced-apart from the first semiconductor pillar;
a fourth semiconductor pillar protruding upward from the second active region, the fourth semiconductor pillar being spaced-apart from the second semiconductor pillar;
a second gate mask that is spaced-apart from the first gate mask, the second gate mask extending to cross over the first active region, the second gate mask surrounding upper portions of sidewalls of the third and fourth semiconductor pillars; and
a second gate line below the second gate mask, the second gate line being spaced-apart from the first and second active regions, the second gate line surrounding parts of the sidewalls of the third and fourth semiconductor pillars.

10. A semiconductor device comprising:
a substrate;
a trench isolation region on the substrate that defines first and second spaced-apart active regions;
a first semiconductor pillar protruding upward from the first active region;
a second semiconductor pillar protruding upward from the second active region;
a first gate mask extending to cross over the first and second active regions, the first gate mask surrounding upper portions of sidewalls of the first and second semiconductor pillars;
a first gate line below the first gate mask, the first gate line being spaced-apart from the first and second active regions, the first gate line surrounding parts of the sidewalls of the first and second semiconductor pillars;
a first conductive pattern formed on an upper sidewall of the first active region; and
a second conductive pattern formed on an upper sidewall of the second active region.

11. The device of claim 10, further comprising:
a first impurity region provided in the first active region adjacent to the first conductive pattern;
a second impurity region provided in an upper region of the first semiconductor pillar;
a third impurity region provided in the second active region adjacent to the second conductive pattern; and
a fourth impurity region provided in an upper region of the second semiconductor pillar.

12. The device of claim 11, wherein the first impurity region extends from the upper regions of the first active region to a lower region of the first semiconductor pillar, and wherein the second impurity region extends from the upper regions of the second active region to a lower region of the second semiconductor pillar.

13. The device of claim 11, wherein at least one of the first to fourth impurity regions does not horizontally overlap the first gate line.

14. The device of claim 10, wherein an upper portion of the trench isolation region contacts a sidewall of the first conductive region.

15. The device of claim 10, further comprising a buffer insulating pattern formed below the first gate line, wherein the buffer insulating pattern has a sidewall that is vertically aligned with a sidewall of the first gate line.

16. The device of claim 10, further comprising a gap fill insulating layer provided at both sides of the first gate line and between the upper regions of the first and second active regions, wherein the portion extending between the upper regions of the first and second active regions constitutes a part of the trench isolation region.

17. The device of claim 10, further comprising:
a third semiconductor pillar protruding upward from the first active region, the third semiconductor pillar being spaced-apart from the first semiconductor pillar;
a fourth semiconductor pillar protruding upward from the second active region, the fourth semiconductor pillar being spaced-apart from the second semiconductor pillar;
a second gate mask that is spaced-apart from the first gate mask, the second gate mask extending to cross over the first active region, the second gate mask surrounding upper portions of sidewalls of the third and fourth semiconductor pillars; and
a second gate line below the second gate mask, the second gate line being spaced-apart from the first and second active regions, the second gate line surrounding parts of the sidewalls of the third and fourth semiconductor pillars.

18. A semiconductor device comprising:
a substrate;
a trench isolation region on the substrate that defines first and second spaced-apart active regions;
a first semiconductor pillar protruding upward from the first active region;
a second semiconductor pillar protruding upward from the second active region;
a first gate mask extending to cross over the first and second active regions, the first gate mask surrounding upper portions of sidewalls of the first and second semiconductor pillars;
a first gate line below the first gate mask, the first gate line being spaced-apart from the first and second active regions, the first gate line surrounding parts of the sidewalls of the first and second semiconductor pillars; and
a gap fill insulating layer provided at both sides of the first gate line and between the upper regions of the first and second active regions, wherein the portion extending between the upper regions of the first and second active regions constitutes a part of the trench isolation region.

19. The device of claim 18, further comprising a buffer insulating pattern formed below the first gate line, wherein the buffer insulating pattern has a sidewall that is vertically aligned with a sidewall of the first gate line.

20. The device of claim 18, further comprising:
a third semiconductor pillar protruding upward from the first active region, the third semiconductor pillar being spaced-apart from the first semiconductor pillar;
a fourth semiconductor pillar protruding upward from the second active region, the fourth semiconductor pillar being spaced-apart from the second semiconductor pillar;
a second gate mask that is spaced-apart from the first gate mask, the second gate mask extending to cross over the first active region, the second gate mask surrounding upper portions of sidewalls of the third and fourth semiconductor pillars; and
a second gate line below the second gate mask, the second gate line being spaced-apart from the first and second active regions, the second gate line surrounding parts of the sidewalls of the third and fourth semiconductor pillars.

* * * * *